United States Patent
Yamae

(10) Patent No.: US 9,112,174 B2
(45) Date of Patent: Aug. 18, 2015

(54) ORGANIC ELECTROLUMINESCENT ELEMENT

(75) Inventor: Kazuyuki Yamae, Nara (JP)

(73) Assignee: PANASONIC CORPORATION, Osaka (JP)

( * ) Notice: Subject to any disclaimer, the term of this patent is extended or adjusted under 35 U.S.C. 154(b) by 6 days.

(21) Appl. No.: 14/238,368

(22) PCT Filed: Aug. 9, 2012

(86) PCT No.: PCT/JP2012/070363
§ 371 (c)(1),
(2), (4) Date: Feb. 11, 2014

(87) PCT Pub. No.: WO2013/024787
PCT Pub. Date: Feb. 21, 2013

(65) Prior Publication Data
US 2014/0191226 A1  Jul. 10, 2014

(30) Foreign Application Priority Data

Aug. 12, 2011  (JP) .................................. 2011-177204

(51) Int. Cl.
*H01L 29/08* (2006.01)
*H01L 35/24* (2006.01)
*H01L 51/00* (2006.01)
(Continued)

(52) U.S. Cl.
CPC ........ *H01L 51/5044* (2013.01); *H01L 51/5036* (2013.01); *H01L 51/5265* (2013.01); *H01L 51/5278* (2013.01); *H01L 2251/558* (2013.01)

(58) Field of Classification Search
None
See application file for complete search history.

(56) References Cited

U.S. PATENT DOCUMENTS

| | | |
|---|---|---|
| 6,107,734 A | 8/2000 | Tanaka et al. |
| 7,126,267 B2 | 10/2006 | Liao et al. |
| 7,915,812 B2 | 3/2011 | Hasegawa |

(Continued)

FOREIGN PATENT DOCUMENTS

| | | |
|---|---|---|
| JP | 2003-045676 A | 2/2003 |
| JP | 2004-165154 A | 6/2004 |

(Continued)

OTHER PUBLICATIONS

International Search Report issued in International Application No. PCT/JP2012/070363 with Date of mailing Nov. 13, 2012, with English Translation.

*Primary Examiner* — Scott B Geyer
*Assistant Examiner* — Abdulfattah Mustapha
(74) *Attorney, Agent, or Firm* — McDermott Will & Emery LLP

(57) ABSTRACT

An organic electroluminescent element having a structure in which a plurality of light-emitting layers stacked between a first electrode with light reflectivity and a second electrode with optical transparency while one or more interlayers with a light transmissive property are interposed between the plurality of light-emitting layers. A first interlayer is formed as the interlayer closest to the first electrode. A first light-emitting unit is formed between the first electrode and the first interlayer to include a first light-emitting layer which has a first light-emitting source, and a second light-emitting unit is formed on a side of the first interlayer close to the second electrode to include a second light-emitting layer which has a second light-emitting source. The first interlayer is a semi-transmissive layer which has both of optical transparency and light reflectivity and has a total light absorption ratio of 10% or less.

8 Claims, 14 Drawing Sheets

(51) Int. Cl.
*H01L 51/50* (2006.01)
*H01L 51/52* (2006.01)

(56) References Cited

U.S. PATENT DOCUMENTS

| | | |
|---|---|---|
| 2005/0264174 A1 | 12/2005 | Liao et al. |
| 2007/0029539 A1* | 2/2007 | Yashima et al. ............. 257/13 |
| 2008/0224968 A1 | 9/2008 | Kashiwabara |
| 2009/0212692 A1 | 8/2009 | Hasegawa |
| 2011/0018023 A1 | 1/2011 | Mikami |
| 2011/0031480 A1* | 2/2011 | Nakamura et al. ............. 257/40 |
| 2011/0114981 A1 | 5/2011 | Higaki et al. |

FOREIGN PATENT DOCUMENTS

| | | |
|---|---|---|
| JP | 2006-005340 A | 1/2006 |
| JP | 3884564 B2 | 2/2007 |
| JP | 2008-501223 A | 1/2008 |
| JP | 2008-218396 A | 9/2008 |
| JP | 2008-225179 A | 9/2008 |
| JP | 2009-231274 A | 10/2009 |
| JP | 2009-238507 A | 10/2009 |
| JP | 2010-103090 A | 5/2010 |
| JP | 2010-108652 A | 5/2010 |
| JP | 2011-018451 A | 1/2011 |

* cited by examiner

ORGANIC ELECTROLUMINESCENT ELEMENT

RELATED APPLICATIONS

This application is the U.S. National Phase under 35 U.S.C. §371 of International Application No. PCT/JP2012/070363, file on Aug. 9, 2012, which in turn claims the benefit of Japanese Application No. 2011-177204, filed on Aug. 12, 2011,the disclosures of which Applications are incorporated by reference herein.

TECHNICAL FIELD

This invention relates to organic electroluminescent elements, and specifically to an organic electroluminescent element with a multiunit structure having a plurality of light-emitting units.

BACKGROUND ART

Generally, as an organic electroluminescent element, an element with a structure in which an anode formed of a transparent electrode, a hole-transport layer, an light-emitting layer, an electron-injection layer, and a cathode are stacked in this order on a surface of a transparent substrate is known. In this organic electroluminescent element, when a voltage is applied between the anode and the cathode, light is produced by the light-emitting layer and emitted to an outside via the transparent electrode and the transparent substrate.

The organic electroluminescent element has features such as being self-luminous, exhibiting relatively highly efficient light-emitting characteristics, and being able to emit light of various tones. Thus, utilization as an illuminant for a display apparatus such as a flat-panel display, and as a light source such as a backlight of a liquid crystal display apparatus and for illumination is expected. Some of these elements have been already commercialized. In order for organic electroluminescent elements to be applied more widely to these applications, development of an organic electroluminescent element having superior characteristics of higher efficiency, longer life, and higher luminance has been desired.

Factors that determine the efficiency of organic electroluminescent elements are mainly the three factors of electro-optical conversion efficiency, drive voltage, and light outcoupling efficiency. In terms of electro-optical conversion efficiency, since so-called phosphorescent materials have appeared recently, external quantum efficiency of more than 20% has been reported. This value is, when converted to internal quantum efficiency, considered to be close to 100%. It can thus be said that an example in which a so-called limiting value in view of electro-optical conversion efficiency is considered to have been reached has been experimentally confirmed. In terms of the drive voltage, an element that emits light of relatively high luminance at a voltage that is 10-20% higher than the voltage corresponding to the energy gap has been obtained. In other words, it can be said that there is not much room for improving the efficiency of organic electroluminescent elements by lowering voltage. Thus, there is considered to be not much expectation of improving the efficiency of organic electroluminescent elements based on these two factors.

On the other hand, the light outcoupling efficiency of an organic electroluminescent element is considered as low as 20-30% in general, and there is much room for improvement. Note that this value varies slightly depending on the light-emitting pattern and the internal layer structure. A material that constitutes a portion where light is generated and the surrounding portion thereof has, in general, characteristics such as a high refractive index and light absorbance. Therefore, light cannot propagate effectively to the outside where light-emission is observed because of the total reflection at an interface between layers with different refractive indices, absorption of light by materials, and the like, and as a result, the light outcoupling efficiency is considered to be a low value such as described above. That is to say, light that cannot be used effectively as light-emission makes up 70-80% of the total light-emission amount, and there is a great deal of expectancy for improving the efficiency of organic electroluminescent elements by improvement of the light outcoupling efficiency.

Under such circumstances, a large number of attempts have been made to improve the light outcoupling efficiency. Specifically, many attempts to increase light that reaches a substrate layer from an organic layer have been performed. Since the refractive index of an organic layer is about 1.7 and the refractive index of a glass layer that is normally used as a substrate is about 1.5 in general, the total reflection loss (thin film waveguide mode) that occurs at the interface between the organic layer and the glass layer reaches about 50% of the total emitted light. This value is obtained by point light source approximation and by taking into consideration the fact that light-emission is an accumulation of three dimensionally radiated light from organic molecules. It is possible to greatly improve the light outcoupling efficiency of an organic electroluminescent element by reducing the total reflection loss at the interface between the organic layer and the substrate.

Utilization of interference action is conceivable as one measure to reduce the total reflection loss. Since the thickness of the light-emitting layer of an organic electroluminescent element is relatively thin at several hundred nanometers and is very close to the wavelength of light (wavelength when propagating in medium), thin-film interference occurs inside the organic electroluminescent element. As a result, the intensity of emitted light greatly increases or decreases depending on the thickness of the organic layer because of interference of emitted light inside the element. In order to maximize the emitted light intensity, the light (direct light) that directly propagates toward the light outcoupling side from the light-emitting layer is caused to interfere with the light that propagates toward the light outcoupling side after propagating toward the reflective electrode from the light-emitting layer and being reflected by this electrode so that the light intensity is increased. For example, under the condition that a phase shift n occurs in the light after being reflected by the light reflective electrode from the light before being reflected, the optical film thickness D derived by multiplying thickness d of a film interposed between a light-emitting source in the light-emitting layer and a surface of the reflective electrode by the refractive index n of the film is designed to be approximately the same as an odd multiple of ¼Π of the light wavelength λ. Thus, it is expected that a component amount of the light that is emitted in the frontal direction from the substrate will be maximized. It means that, in this method, light propagating in a specific direction, such as in the frontal direction in which light is easily extracted to the air, for example, is intensified by changing the distribution of light rather than the light being amplified internally. Since an increase in light in one direction is offset by a decrease in light in the other direction, the total light amount cannot be amplified above a theoretical value.

However, in actuality, the phase shift of light is not equal to Π, and light shows more complex behavior. This is because, in an actual organic electroluminescent element, refraction and extinction in the organic layer and the reflection layer exert an influence. This actual phase shift may be expressed as a phase difference θ(λ), for example.

In Patent Document 1, calculating a phase difference θ(λ) using a complex number r(λ) that is calculated from the refractive indices and extinction coefficients of the organic layer and the reflection layer is described. Then, with consideration for this phase difference θ(λ), causing an optical film thickness D from the light-emitting source to the surface of the electrode to satisfy all the following relations so that the component of light that propagates outside the substrate can take a maximum value is described.

$$\theta(\lambda) = \mathrm{Arg}(r(\lambda))$$

$$2\Pi/9 \leq \theta(\lambda) \leq 15\Pi/18$$

$$D(\lambda) = \theta(\lambda) * \lambda/4\Pi$$

$$0.73 D(\lambda) \leq d(\lambda) \leq 1.15 D(\lambda)$$

Note that, in the above equations, λ represents a maximum peak wavelength of emitted light, θ(λ) represents a phase difference caused by the reflective electrode, and d(λ) represents an optical path length between the transmission electrode and the reflective electrode at the wavelength λ.

Furthermore, in Patent Document 2, a microcavity structure is shown as a technique to increase the light intensity by actively utilizing the optical interference effect. The layer structure shown in Patent Document 2 is shown in FIG. 15. In this element, a reflection layer 21, a transparent conductive layer 22, an organic compound layer (e.g., a hole-transport layer 23, a light-emitting layer 24, an electron-transport layer 25, an electron-injection layer 26), a semi-transmissive layer 27, and a transparent electrode 28 are formed on a substrate 20. Then, the thickness of the transparent conductive layer 22 is set at different values depending on the region, and a first region 29a in which the optical path length of the resonator structure is relatively short and a second region 29b in which the optical path length of the resonator structure is relatively long are formed. This structure is effective in increasing chromatic purity and in improving frontal luminance in a single color device.

CITATION LIST

Patent Documents

Patent Document 1: Japanese Patent Application Publication No. 2004-165154
Patent Document 2: Japanese Patent Application Publication No. 2009-231274
Patent Document 3: Japanese Patent Application Publication No. 2008-225179
Patent Document 4: Japanese Patent Publication No. 3884564

SUMMARY OF INVENTION

Solution to Problem

In recent years, achieving higher luminance, higher efficiency, and a longer life of an organic electroluminescent element has been a major challenge, and organic electroluminescent elements with a multiunit structure have attracted much attention. Since the multiunit structure includes a plurality of light-emitting layers connected in series while electric conductive layers (referred to as interlayers) are interposed therebetween, the multiunit makes it possible to realize high luminance, high efficiency, and a long life while securing the merit of a thin light source for which organic electroluminescent elements are known. High efficiency and long life can be achieved by reducing a current density that is required to obtain the same luminance.

However, in an element with the multiunit structure, it has been difficult to improve a light outcoupling property by the optical design described in the above Patent Documents.

In the method described in Patent Document 1, the component amount of light that is emitted outside in the frontal direction from the substrate is designed to be maximized. Since the multiunit structure that is advantageous in terms of high luminance and a long life as described above provides a plurality of light emitting positions and a plurality of emission wavelengths, it has been very difficult to have a preferable film thickness condition that satisfies the relations.

The method described in Patent Document 2 is expected to have an effect of providing high efficiency of luminance compared with the method in Patent Document 1. However, since the structure in Patent Document 2 is focused on light of a specific wavelength or in a specific direction, it is not necessarily the preferred design for increasing light flux at a plurality of wavelengths that is emitted in all directions. Moreover, in a case where the light-emitting layer emits light that has a plurality of light colors and a broad spectrum, an adverse effect of chromaticity shift due to a viewing angle difference becomes extremely great, and a problem of viewing angle dependence occurs in which colors differ depending on the viewing angle and the visual quality deteriorates.

Patent Document 3 discloses a method in which the viewing angle dependence is reduced by implementing a structure that has a plurality of resonant distances in one element. However, in the method in Patent Document 3, although the structure is devised taking the chromaticity shift into consideration, since layers with different thicknesses are included in one element, the manufacturing process becomes complicated. Also, application to a structure that has a plurality of emission colors such as the multiunit structure is difficult.

In terms of an organic electroluminescent element with the multiunit structure, Patent Document 4 discloses that a thin film metal is used as the interlayer of the light-emitting unit in order to increase luminance of the element. However, regarding thin film metal, it is only disclosed that higher transmissivity of the thin film metal is desirable, that is, a thinner thin film metal or no thin film layer is preferable. A design to improve luminance by the microcavity has thus not been achieved. Therefore, it is difficult to further improve the light outcoupling efficiency by the technique described in Patent Document 4.

The present invention has been made in view of the above-described problems, and an object of the present invention is to provide an organic electroluminescent element with a multiunit structure having improved light outcoupling efficiency.

Solution to Problem

An organic electroluminescent element according to the present invention has a structure in which a plurality of light-emitting layers are stacked between a first electrode with light reflectivity and a second electrode with optical transparency while one or more interlayers with a light transmissive property are interposed between the plurality of light-emitting layers. The one or more interlayers include a first interlayer closest to the first electrode. A first light-emitting unit is formed between the first electrode and the first interlayer to include a first light-emitting layer that is one of the plurality of light-emitting layers and has a first light-emitting source. A second light-emitting unit is formed on a side of the first interlayer close to the second electrode to include a second light-emitting layer which is one of the plurality of light-emitting layers and has a second light-emitting source. The first interlayer is a semi-transmissive layer which has both of optical transparency and light reflectivity and has a total light absorption ratio of 10% or less.

In a preferable aspect of the organic electroluminescent element, the semi-transmissive layer has a total light reflectance of 10% or more but less than 50%.

In a preferable aspect of the organic electroluminescent element, the semi-transmissive layer contains Ag or an alloy of Ag as a main component.

In a preferable aspect of the organic electroluminescent element, the organic electroluminescent element has a characteristic which satisfies relations of:

$$0.9*X \leq D_1(\lambda_1) \leq 1.1*X;$$

$$0.1*Y \leq D_3(\lambda_2) \leq 2.0*Y; \text{ and}$$

$$0.8*Z \leq D_1(\lambda_1) + D_2(\lambda_1) \leq 1.2*Z,$$

wherein $\lambda_1$ represents a weighted-averaged emission wavelength of the first light-emitting source, $\lambda_2$ represents a weighted-averaged emission wavelength of the second light-emitting source, $D_1(\lambda_1)$ represents an optical path length defined as a product of a refractive index at the wavelength $\lambda_1$ and a thickness with regard to a medium situated between the first light-emitting source and the first electrode, $D_2(\lambda_1)$ represents an optical path length defined as a product of a refractive index at the wavelength $\lambda_1$ and a thickness with regard to a medium situated between the first light-emitting source and the semi-transmissive layer, and $D_3(\lambda_2)$ represents an optical path length defined as a product of a refractive index at the wavelength $\lambda_2$ and a thickness with regard to a medium situated between the second light-emitting source and the semi-transmissive layer.

X, Y, and Z satisfy equations of: $X=\phi_1(\lambda_1)*(\lambda_1/4\Pi)+(\lambda_1*l/2)$; and $Y=\phi_2(\lambda_2)*(\lambda_2/4\Pi)+(\lambda_2*m/2)$; and $Z=(\phi_1(\lambda_1)+\phi_2(\lambda_1))*(\lambda_1/4\Pi)+(\lambda_1*n/2)$, respectively, wherein: l, m, and n are integers of 0 or more, respectively; $\phi_1$ represents a phase shift expressed by a following formula (1) which occurs at the first electrode; and $\phi_2$ represents a phase shift expressed by the following formula (1) which occurs at the semi-transmissive layer; and $\phi_1(\lambda_1)$ represents a phase shift of light emitted from the first light-emitting source which arises from reflection at the first electrode; and $\phi_2(\lambda_1)$ represents a phase shift of light emitted from the first light-emitting source which arises from reflection at the semi-transmissive layer; and $\phi_2(\lambda_2)$ represents a phase shift of light emitted from the second light-emitting source which arises from reflection at the semi-transmissive layer.

The formula (1) is:

$$\varphi = \tan^{-1}\left\{\frac{2(n_1 k_2 - n_2 k_1)}{n_1^2 - n_2^2 + k_1^2 - k_2^2}\right\}, \quad (1)$$

wherein: $n_1$ and $k_1$ represent a refractive index and an extinction coefficient of a layer in contact with a reflection layer, respectively; and $n_2$ and $k_2$ represent a refractive index and an extinction coefficient of the reflection layer, respectively; and $n_1$, $n_2$, $k_1$, and $k_2$ are functions of $\lambda$.

In a preferable aspect of the organic electroluminescent element, l is not less than 1 in the equation for X.

In a preferable aspect of the organic electroluminescent element, l, m, and n are not less than 1, respectively in the equations for X, Y, and Z.

In a preferable aspect of the organic electroluminescent element, a light diffusion layer is formed on an outcoupling face of the second electrode.

In a preferable aspect of the organic electroluminescent element, an optical path length $D_d(\lambda_1)$ between a face of the light diffusion layer close to an outcoupling side and the semi-transmissive layer at the wavelength $\lambda_1$ is ten times or more as long as an emission peak wavelength $\lambda_1$ of the first light-emitting unit.

In a preferable aspect of the organic electroluminescent element, a substrate with optical transparency is provided on the outcoupling face of the second electrode, and the substrate has a refractive index of 1.55 or more.

Advantageous Effects of the Invention

According to the present invention, higher luminance and longer life can be obtained by use of the multiunit structure. A semi-transmissive layer with a low absorption ratio is used as the interlayer, and therefore an amount of light that is radiated outside can be increased owing to the microcavity effect. As a result, it is possible to obtain an organic electroluminescent element with high luminance, long life, and high light outcoupling efficiency.

DESCRIPTION OF EMBODIMENTS

Figure 1:
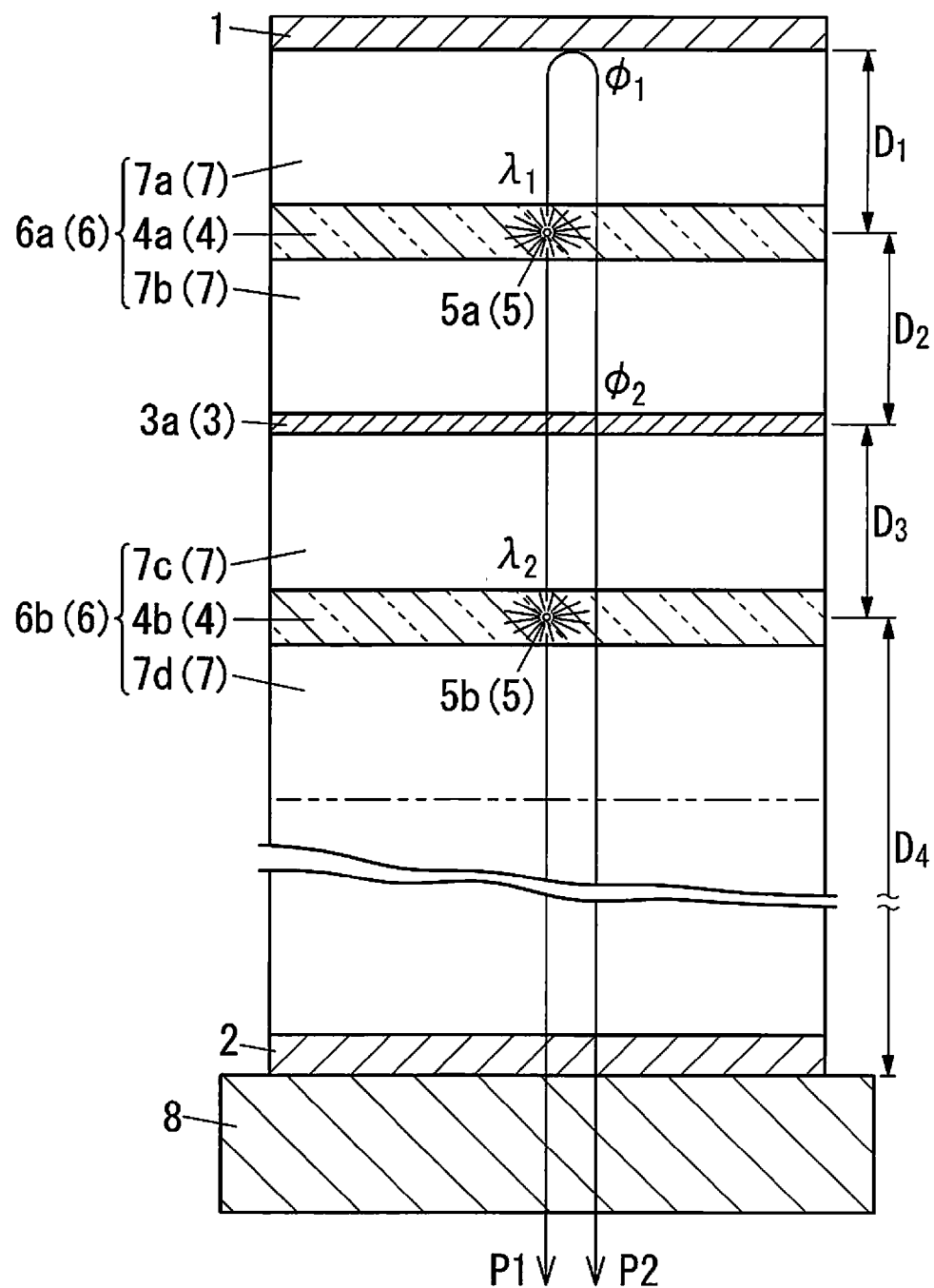
FIG. 1 is a schematic cross-section illustrating an example of an embodiment of the organic electroluminescent element.

FIG. 1 shows an example of an embodiment of the organic electroluminescent element. The organic electroluminescent element has a structure in which a plurality of light-emitting layers 4 are stacked between a first electrode 1 with light reflectance and a second electrode 2 with optical transparency while one or more interlayers with a light transmissive property are interposed between the plurality of light-emitting layers. Each light-emitting layer 4 includes a light-emitting source 5 composed of a light-emission material, and each unit having the light-emitting source 5 is a light-emitting unit 6. Thus, the organic electroluminescent element has a multiunit structure including a plurality of light-emitting units 6.

One or more interlayers 3 are each interposed between two light-emitting layers 4. That is to say, the layer structure is such that light-emitting layers 4 and interlayers 3 are alternately arranged in the following manner: light-emitting layer 4, interlayer 3, light-emitting layer 4, interlayer 3, and light-emitting layer 4.

Among the interlayers 3, the interlayer 3 that is closest to the first electrode 2 is a first interlayer 3a. Therefore, when the organic electroluminescent element includes a plurality of interlayers 3, the interlayer 3 that is closest to the first electrode 2 is the first interlayer 3a, and when the organic electroluminescent element includes one interlayer 3, this interlayer 3 is the first interlayer 3a.

The organic electroluminescent element includes at least two light-emitting units 6, and the light-emitting units 6 may be numbered as first, second, third, etc., in this order from the first electrode 1. The number of interlayers 3 is one less than the number of light-emitting units 6. Then, each of the interlayers 3 is provided between adjacent two of the light-emitting units 6. With providing the interlayer 3, each of the light-emitting units 6 can be provided independently as a unit for light-emission, and injection of holes and electrons to the light-emitting unit 6 can be carried out smoothly. As a result, the element with the multiunits can be enabled to emit light, and can have higher luminance and longer life.

A first light-emitting unit 6a of the light-emitting units 6 includes a first light-emitting source 5a and is formed between the first electrode 1 and the first interlayer 3a. In the first light-emitting unit 6a, the first light-emitting source 5a is provided in a first light-emitting layer 4a. Similarly, a second light-emitting unit 6b of the light-emitting units 6 including a second light-emitting source 5b is formed as the light-emitting unit 6 located adjacent to the first light-emitting unit 6a and on the closest side of the first interlayer 3a to the second electrode 2. In the second light-emitting unit 6b, the second light-emitting source 5b is provided in a second light-emitting layer 4b.

The light-emitting unit 6 includes appropriate layers to constitute the organic electroluminescent element, in addition to the light-emitting layer 4. In the organic electroluminescent element, light-emission from a light-emitting material can be caused by combination of holes and electrons. Therefore, layers to support injection and transportation of charges are provided such as layers having functions of injecting and transporting holes, layer having functions of injecting and transporting electrons, or the like. In this description, these layers are referred to as charge auxiliary layers 7. These charge auxiliary layers 7 include appropriate layers selected from an electron-injection layer, an electron-transport layer, a hole-transport layer, a hole-injection layer, and the like.

The light-emitting unit 6 may have a structure in which the light-emitting layer 4 is interposed between the charge auxiliary layer 7 close to the first electrode 1 and the charge auxiliary layer 7 close to the second electrode 2. From the viewpoint of charge transfer, it is preferable that one of these two charge auxiliary layers 7 is a layer having electron transportability, and the other is a layer having hole transportability. For example, in a case where the first electrode 1 functions as a cathode and the second electrode 2 functions an anode, the charge auxiliary layer 7 close to the first electrode 1 may have electron transportability, and the charge auxiliary layer 7 close to the second electrode 2 may have hole transportability.

In the first light-emitting unit 6a, a first charge auxiliary layer 7a is formed between the first electrode 1 and the first light-emitting layer 4a, and a second charge auxiliary layer 7b is formed between the first light-emitting layer 4a and the first interlayer 3a. Similarly, in the second light-emitting unit 6b, a third charge auxiliary layer 7c is formed between the first interlayer 3a and the second light-emitting layer 4b, and a fourth charge auxiliary layer 7d is formed on a side of the second light-emitting layer 4b close to the second electrode 2. Therefore, the first interlayer 3a is provided between the first light-emitting unit 6a and the second light-emitting unit 6b.

Layers that constitute the organic electroluminescent element are, normally, provided to be stacked on the surface of a substrate 8. In the embodiment shown in FIG. 1, the second electrode 2 is formed on the substrate 8, and the light-emitting units 6 and the interlayers 3 are arranged alternately from the second electrode 2 to the first electrode 1. Then, regarding the vicinity of the first electrode 1, the second light-emitting unit 6b, the first interlayer 3a, the first light-emitting unit 6a, and the first electrode 1 are arranged in this order from the second electrode 2. Light is emitted via the second electrode 2 (i.e., an optically transparent electrode), that is, a side of the organic electroluminescence element close to the substrate 8. Therefore, the embodiment in FIG. 1 is an organic electroluminescent element with a bottom emission structure.

Figure 2:
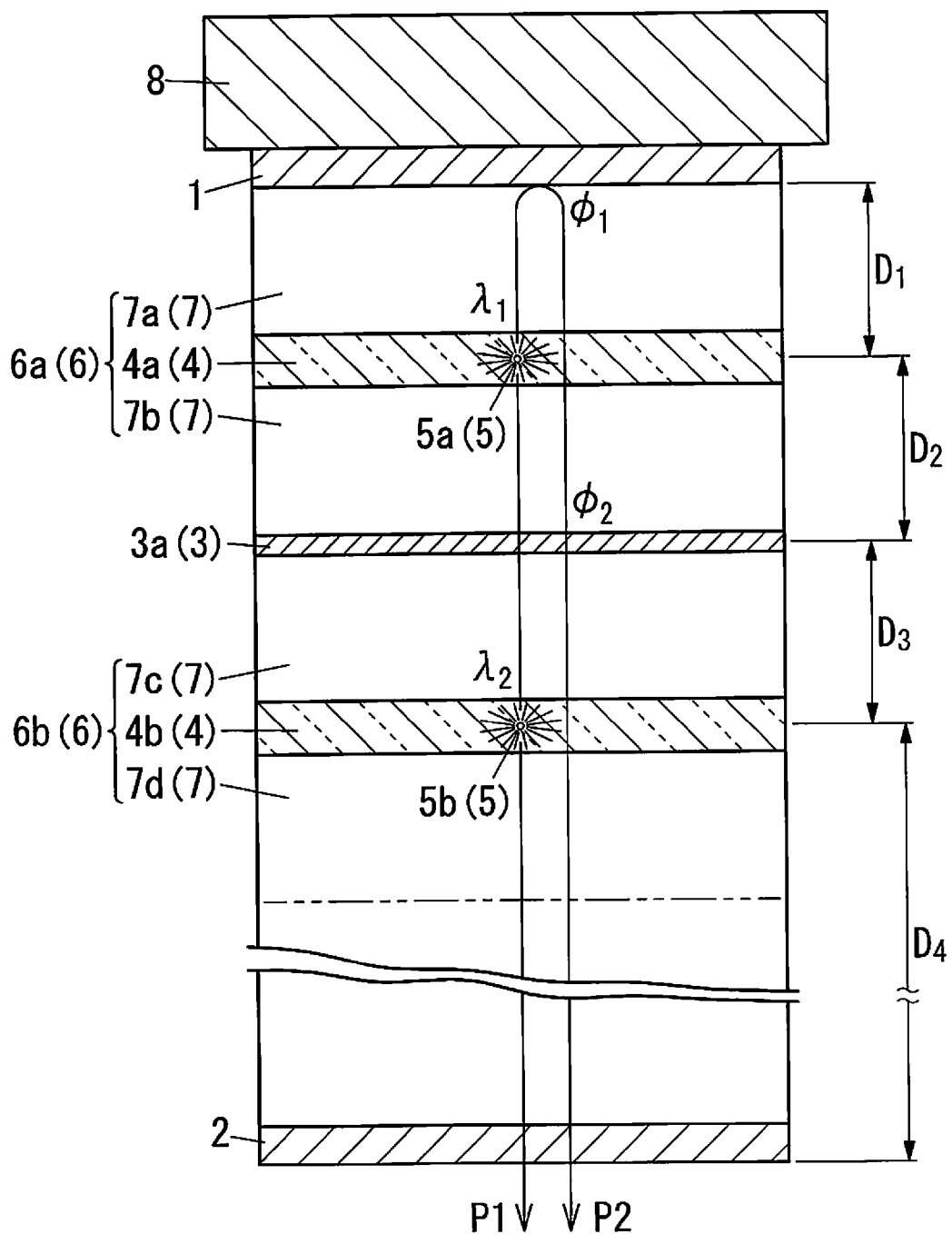
FIG. 2 is a schematic cross-section illustrating an example of an embodiment of the organic electroluminescent element.

FIG. 2 shows an embodiment of the organic electroluminescent element, and the position of the substrate 8 differs from that of the embodiment in FIG. 1. The other configurations are similar to the embodiment in FIG. 1. In the embodiment shown in FIG. 2, the first electrode 1 is formed on the substrate 8, and the light-emitting units 6 and the interlayers 3 are arranged alternately from the first electrode 1 to the second electrode 2. Then, regarding the vicinity of the first electrode 1, the first electrode 1, the first light-emitting unit 6a, the first interlayer 3a, and the second light-emitting unit 6b are arranged in this order. Light is emitted via the second electrode 2, which is an optically transparent electrode, that is, a side of the organic electroluminescence element far from the substrate 8. Therefore, the embodiment in FIG. 2 is an organic electroluminescent element with a top emission structure.

As shown in FIGS. 1 and 2, light is generated by combination of holes and electrons in the light-emitting sources 5. The light generated in the light-emitting source 5 is divided broadly into light that propagates toward the first electrode 1 and light that propagates toward the second electrode 2. The light that propagates toward the second electrode 2 directly from the light-emitting source 5 passes through the second electrode 2, and goes outside. A track of this light is shown by arrow P1. The light that propagates toward the first electrode 1 from the light-emitting source 5 is reflected by the first electrode 1 so as to propagate toward the second electrode 2, and subsequently passes through the second electrode 2, and goes outside. A track of this light path is shown by arrow P2. However, rather than the light direction being only parallel to a stacking direction (in the direction vertical to the surface of the substrate 8), there are many light directions that have angles relative to the stacking direction. If the angle of light direction relative to an interface is shallow (if the angle relative to the stacking direction is large) when the light enters the interface between layers, so-called total reflection loss may be induced depending on a relation between the refractive indices of the layers. Total reflection loss is a phenomenon that the light incident on an interface between layers is totally reflected to become waveguide light and is thus lost. This kind of total reflection loss may occur when the light enters a low refractive layer from a high refractive layer.

In the embodiment shown in FIG. 2, the total reflection loss may occur at the interface between the second electrode 2 and the air (outside). That is to say, since the refractive index of the second electrode 2 is usually higher than that of the air, a phenomenon occurs that light that enters an interface between the second electrode 2 and the air at a shallow angle is lost by the total reflection. Note that, even in a case where another layer is provided at the outside surface of the second electrode 2, since the refractive index of the layer is usually higher than that of the air, this kind of total reflection loss may occur.

In the embodiment shown in FIG. 1, since the light is emitted through the substrate 8, the total reflection loss becomes a more serious issue. That is to say, the refractive indices of the second electrode 2 and organic layers (e.g., the charge auxiliary layer 7 and the light-emitting layer 4) are usually higher than the refractive index of the substrate 8 and this would cause a phenomenon that the light that enters an interface between the second electrode 2 and the substrate 8 at a shallow angle is lost by the total reflection. This phenomenon is referred to as a total reflection loss in a thin film waveguide mode. Similarly, the refractive index of the substrate 8 is usually higher than that of the air, and this would causes a phenomenon that the light that enters an interface between the substrate 8 and the air (outside) at a shallow angle is lost by the total reflection. This phenomenon is referred to as a total reflection loss in a substrate waveguide mode. The occurrence of such waveguide modes in which light is lost by the total reflection is a factor that decreases the light outcoupling property.

Here, by causing interference between the light indicated by arrow P1 that propagates directly toward the second electrode 2 and the light indicated by arrow P2 that is reflected by the first electrode 1 so as to change the distribution of light, it is possible to increase the intensity of light that propagates in the direction parallel to the stacking direction (light extraction direction). Then, since light that enters the substrate 8 at a shallow angle decreases with an increase in the intensity of light in the stacking direction, more light can be emitted outside. This effect is referred to as the microcavity effect, and in the present embodiment, it is possible to improve the light outcoupling property with using the microcavity effect. Note that the structure that exhibits the microcavity effect is referred to as a microcavity structure (it may be referred to simply as "cavity structure" in the following).

In the present embodiment, as shown in FIGS. 1 and 2, the microcavity structure that increases the intensity of light of a specific direction by means of light interference is applied to an organic electroluminescent element with a multiunit structure having a plurality of light-emitting layers 4. Specifically, the microcavity structure is applied to the portion that is composed of the two light-emitting units 6 that are arranged close to the light reflective first electrode 1 and the interlayer 3 that is interposed therebetween. Thus, it is possible to further improve the light outcoupling property by enhancing the effect of the microcavity structure.

Wavelengths of light emitted from the first light-emitting layer 4a and the second light-emitting layer 4b may be the same or different. In this embodiment, the microcavity effect can be obtained regardless of the wavelengths of light emitted from the light-emitting layers 4 being the same or different. For example, the wavelength of the light emitted from the first light-emitting layer 4a that is the light-emitting layer 4 opposite from the light outcoupling side may be longer or shorter than the wavelength of light emitted from another light-emitting layer 4 (second light-emitting layer 4b).

In an organic electroluminescent element with the multiunit structure, it is possible to cause interference of light not only by using the reflective first electrode 1 but also by using some reflection at the interlayers 3 (specifically first interlayer 3a). When the light reflected at the interlayers 3 is used, it is possible to improve the light outcoupling property by increasing the intensity of the light in a direction toward outside. Note that, although there is interference in which intensity is increased and interference in which intensity is decreased, in the microcavity structure, light that propagates in the light outcoupling direction is increased.

The first interlayer 3a is a semi-transmissive layer that has both optical transparency and light reflectivity. Therefore, the microcavity effect can be obtained while light can be extracted outside. The total light absorption ratio of the first interlayer 3a is 10% or less. Thus, by suppressing light absorption, the light outcoupling property can be improved. When the total light absorption ratio is greater than 10%, not the microcavity effect but extinction or attenuation of light due to absorption become dominant, and the luminance and efficiency in total may decrease. Here, the total light absorption ratio refers to an average light absorption ratio in the visible light range. The semi-transmissive layer desirably has a smaller total light absorption ratio. Preferably, it is 5% or less. The semi-transmissive layer is considered to have a smaller light absorption ratio as thickness decreases, and, therefore, an absorption ratio of a thin film with the minimum thickness that can be formed stably is the practical lower limit of the absorption ratio. Although the lower limit of the light absorption ratio may be 2%, for example, it may be 1% or 0.5% if a stable thin film is obtained.

The semi-transmissive layer preferably has a total light reflectance of 10% or more but less than 50%. That is to say, the semi-transmissive layer of the first interlayer 3a preferably has semi-transmissivity and appropriate reflectivity, and specifically, the average light reflectance thereof in the visible light range is preferably in the above-mentioned range. If the reflectance is smaller than this range, the cavity effect may become difficult to express. Also, if the reflectance is larger than this range, the cavity effect becomes, in contrast, so strong that it has a characteristic of light intensity changing steeply at a specific wavelength and angle, and as a result device design and securing a process margin may become difficult. Moreover, if the reflectance is too large, the light outcoupling property decreases.

The semi-transmissive layer preferably has a total light transmissivity of 50% or more, more preferably of 60% or more, and further preferably of 70% or more. The higher the total light transmissivity of the semi-transmissive layer is, the more light can be extracted to the light outcoupling side by passing more light at the side of the semi-transmissive layer opposite from the light outcoupling side through the semi-transmissive layer. Therefore, the total light transmissivity may be 80% or more, or 90% or more.

The semi-transmissive layer is preferably a layer that contains Ag or an alloy of Ag as a main component. A high microcavity effect thereby can be obtained. Ag or an alloy of Ag is a material having reflectivity. By lowering the total light absorption ratio in such a light reflective material, the microcavity structure can be formed by using the light interference action. The layer that contains Ag or an alloy of Ag as a main component may be made of a metal thin film. The semi-transmissive layer that facilitates obtaining the microcavity structure may be formed of the metal thin film. Moreover, the metal thin film of Ag or Ag alloy is superior from the viewpoint of securing optical transparency. That is to say, if the optical transparency of the semi-transmissive layer (first interlayer 3a) is too low, the light that enters the interlayer 3 from the first light-emitting unit 6a may not pass the interlayer 3. However, since the semi-transmissive layer has optical transparency, it is possible to extract the light from the first light-emitting unit 6a to the outside therethrough.

TABLE 1 shows reflection/transmission/absorption characteristics of various metals in a thin film state and a bulk state. Here, the characteristics of a film in the thin film state is shown as those of a film with a thickness of 10 nm, and the characteristics of a film in the bulk state are shown as those of a film with a thickness of 200 nm are shown. Note that, since the transmissivity is 0% in the bulk state, description thereof is omitted.

Figure 12A:
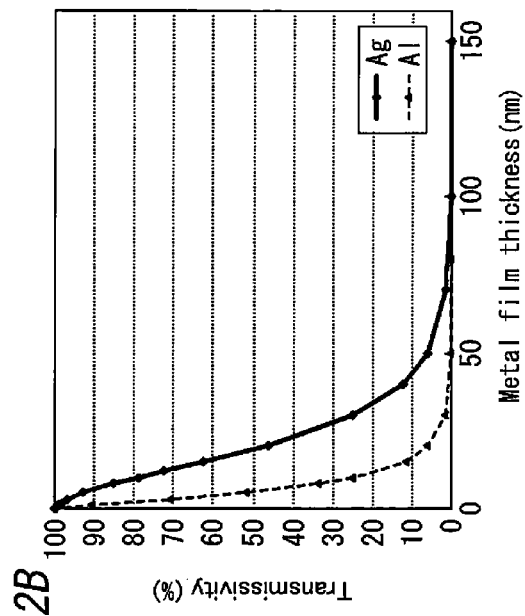
FIG. 12A is a graph showing a relation between a film thickness and light reflectance.
Figure 12B:
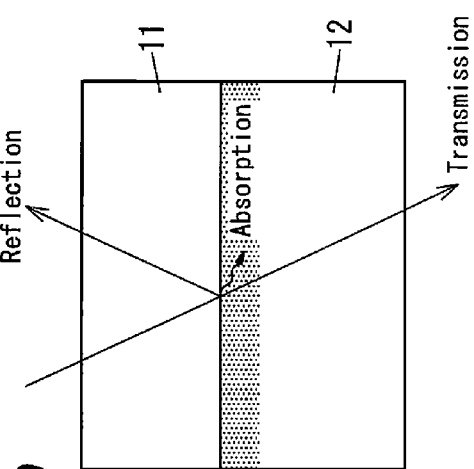
FIG. 12B is a graph showing a relation between a film thickness and light transmissivity.
Figure 12C:
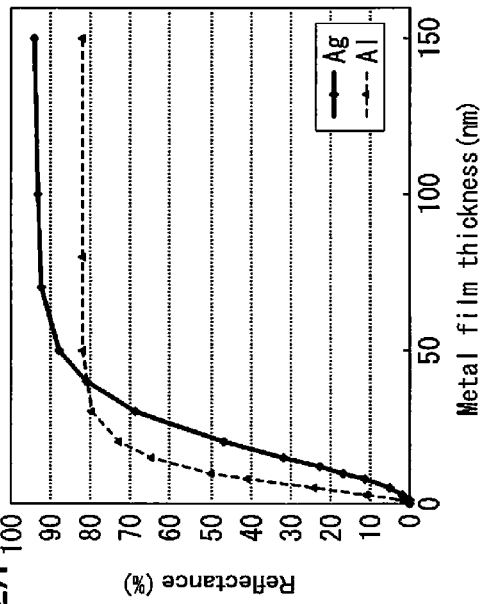
FIG. 12C is a graph showing a relation between a film thickness and a light absorption ratio.
Figure 12D:
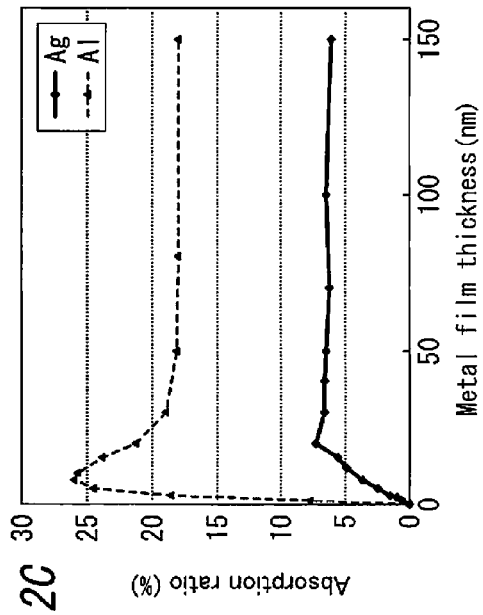
FIG. 12D is a schematic diagram illustrating behavior of light that enters an interface.

In FIGS. 12A to 12C, graphs of reflection/transmission/absorption characteristics when the thickness of Ag film and Al film is changed are shown. FIG. 12A shows reflection characteristics, FIG. 12B shows transmission characteristics, and FIG. 12C shows absorption characteristics. FIG. 12D schematically shows a mechanism by which light is reflected, transmitted, and absorbed when the light passes through an interface. TABLES 2 and 3 show values of reflection/transmission/absorption characteristics of Ag and Al when the thickness thereof is changed. TABLE 2 is for Ag, and TABLE 3 is for Al. As shown in FIG. 12D, when light enters a metal film 12 from a film 11 of an organic layer (refractive index n=1.8, for example), a part of the light is reflected, a part of the remaining light is transmitted, and the other light is absorbed in the metal film 12. Thus, in a design of the interlayer 3, consideration can be given to reflection/transmission/absorption separately.

In order to provide the microcavity effect, the semi-transmissive layer (first interlayer 3a) is required to have small light absorbability and appropriate reflectivity. A case in which a metal thin film is used as the semi-transmissive layer will be discussed.

With regard to metal thin films, TABLE 1 shows that Ag is useful as a material having reflectivity along with an absorption ratio of 10% or less. Although Al is a material having reflectivity other than Ag, as shown in the graphs in FIGS. 12A to 12C and TABLES 2 and 3, Al has a high absorption ratio even with a small thickness, and the absorption ratio thereof exceeds 10% around a thickness range of 1 to 2 nm. When a metal film is formed by vapor deposition, in a film formation in a thickness range of 1 to 2 nm, the film has a striped shape rather than a uniform thin film, and control for forming a film becomes extremely difficult. Moreover, since a striped metal film does not have good conductivity, it may not be able to function as the interlayer 3. Therefore, a stable metal thin film of Al with an absorption ratio of 10% or less is not easy to form. On the other hand, an Ag thin film is applied to the microcavity structure easily, since an absorption ratio thereof is 10% or less even with the thickness of 150 nm. The lower limit of thickness of a metal thin film is about 5 nm from the viewpoint of obtaining a stable thin film. The upper limit of thickness of a metal thin film is not specifically given, and it may be 150 nm or may be 100 nm. In a case of an Ag film, the thickness thereof may be 20 nm or less in order to have reflectance of less than 50%.

A material of the metal thin film preferably contains Ag. Specifically, in addition to pure Ag, an alloy of Ag with a metal listed in TABLE 1 (Al, Pt, Rh, Mg, Au, Cu, Zn, Ti, Pd, and Ni) may be used. Among these, specifically, alloys of MgAg, PdAg are preferably used. The metal content of other than Ag in the alloy may be in such a range that the total light absorption ratio is 10% or less is satisfied, and is, for example, 0 to 3 mass % depending on a structure of the alloy. Note that MgAg in TABLE 1 has a content rate of Mg of 1 mass % as an example.

TABLE 1

|  | Thin film (10 nm) | | | Bulk (200 nm) | |
| --- | --- | --- | --- | --- | --- |
|  | Reflectance | Transmissivity | Absorption ratio | Reflectance | Absorption ratio |
| Ag | 16.8 | 78.6 | 4.6 | 92.7 | 7.3 |
| Al | 48.6 | 25.8 | 25.6 | 81.8 | 18.2 |
| Mg | 17.4 | 70.3 | 12.3 | 81.6 | 18.4 |
| Au | 8.3 | 78.6 | 13.1 | 64.8 | 35.2 |
| Cu | 10.3 | 70.9 | 18.8 | 61.5 | 38.5 |
| Zn | 23.4 | 45.1 | 31.5 | 65.8 | 34.2 |
| Ti | 8.0 | 55.9 | 36.1 | 32.5 | 67.5 |
| Pd | 17.4 | 46.4 | 36.2 | 55.3 | 44.7 |
| Ni | 12.3 | 49.8 | 37.9 | 43.6 | 56.4 |
| Pt | 14.7 | 44.2 | 41.1 | 44.9 | 55.1 |
| Rh | 16.4 | 37.1 | 46.5 | 40.1 | 59.9 |
| MgAg | 17.0 | 76.5 | 6.5 | 92.1 | 7.9 |

TABLE 2

| Ag film thickness(nm) | Reflectance (%) | Transmissivity (%) | Absorption ratio (%) |
| --- | --- | --- | --- |
| 0 | 0.0 | 100 | 0.0 |
| 1 | 0.2 | 99.3 | 0.5 |
| 2 | 0.8 | 98.2 | 1.0 |
| 3 | 1.8 | 96.7 | 1.5 |
| 5 | 4.8 | 92.8 | 2.4 |
| 8 | 11.4 | 85.0 | 3.6 |
| 10 | 16.8 | 78.6 | 4.6 |
| 12 | 22.7 | 72.4 | 4.9 |
| 15 | 31.8 | 62.6 | 5.6 |
| 20 | 46.4 | 46.3 | 7.3 |
| 30 | 68.6 | 24.7 | 6.7 |
| 40 | 81.2 | 12.1 | 6.7 |
| 50 | 87.7 | 5.8 | 6.5 |
| 70 | 92.5 | 1.3 | 6.2 |
| 100 | 92.8 | 0.1 | 7.1 |
| 150 | 93.0 | 0.0 | 7.0 |

TABLE 3

| Al film thickness(nm) | Reflectance (%) | Transmissivity (%) | Absorption ratio (%) |
| --- | --- | --- | --- |
| 0 | 0.0 | 100 | 0.0 |
| 1 | 1.6 | 90.6 | 7.8 |
| 3 | 11.0 | 70.5 | 18.5 |
| 5 | 23.8 | 51.7 | 24.5 |
| 8 | 40.6 | 33.5 | 25.9 |
| 10 | 48.6 | 25.8 | 25.6 |
| 15 | 64.8 | 11.5 | 23.7 |
| 20 | 73.0 | 5.8 | 21.2 |
| 30 | 79.7 | 1.4 | 18.9 |

TABLE 3-continued

| Al film thickness(nm) | Reflectance (%) | Transmissivity (%) | Absorption ratio (%) |
|---|---|---|---|
| 50 | 81.9 | 0.1 | 18.0 |
| 80 | 81.8 | 0.0 | 18.2 |
| 150 | 81.8 | 0.0 | 18.2 |

The semi-transmissive layer may include a stacked structure of an aforementioned metal thin film and a conductive metal oxide film. In this case also, the interlayer 3 having semi-transmissivity and a low total light absorption ratio may be formed. ITO, IZO, AZO, ZnO, and the like are exemplary conductive metal oxide films. The conductive metal oxide film may be stacked on a face of the metal thin film facing the first electrode 1, may be stacked on a face of the metal thin film facing the second electrode 2, or may be stacked on both faces of the metal thin film.

Next, more preferable conditions to obtain the microcavity effect will be described. In the microcavity structure, interference of light is utilized. Due to setting an optical film thickness (optical path length) of each layer, it is possible to increase the intensity of light in a specific direction with using the interference action more effectively.

FIGS. 1 and 2 illustrate optical path lengths $D_1$ to $D_4$. The optical path length $D_1$ is an optical path length between the first electrode 1 and the first light-emitting source 5a. The optical path length $D_2$ is an optical path length between the first light-emitting source 5a and the first interlayer 3a (semi-transmissive layer). The optical path length $D_3$ is an optical path length between the second light-emitting source 5b and the first interlayer 3a (semi-transmissive layer). The optical path length $D_4$ is an optical path length between the second light-emitting source 5b and the face of the second electrode 2 at the light outcoupling side.

When light is reflected by a reflection layer, the phase of the light after reflection is shifted by n from the phase of the light before reflection. Thus, in an ideal model, an optical film thickness (optical path length) that is derived by multiplying a thickness d between the light-emitting source 5 and the surface of the reflection layer by a refractive index n is designed to be substantially equal to odd multiples of ¼Π of the light wavelength λ. Accordingly, an amount of light component that is emitted in the frontal direction from the substrate takes a maximum value. This method does not imply that light is amplified internally, but rather implies that the distribution of light is changed such that light in a specific direction such as the frontal direction for making the light extraction to the air easy is intensified. However, in actuality, the phase shift of light differs from π, and shows more complex behavior due to refraction at and extinction in the organic layer and the reflection layer being involved. The phase shift of light under this situation is expressed as φ. In the present embodiment, optical film thicknesses may be set with using this phase shift φ.

Here, the phase shift p is a function expressed in the following Equation 1:

$$\varphi = \tan^{-1}\left\{\frac{2(n_1 k_2 - n_2 k_1)}{n_1^2 - n_2^2 + k_1^2 - k_2^2}\right\}. \quad (1)$$

In the above equation, $n_1$ and $k_1$ represent a refractive index and an extinction coefficient of a layer in contact with a reflection layer, respectively, and $n_2$ and $k_2$ represent a refractive index and an extinction coefficient of the reflection layer, respectively, and $n_1$, $n_2$, $k_1$, and $k_2$ are functions of λ.

The phase shift that occurs at the first electrode 1 shown by Equation 1 is expressed as $\phi_1$, and the phase shift that occurs at the semi-transmissive layer shown by Equation 1 is expressed as $\phi_2$. In this case, in the phase shift $\phi_1$, the reflection layer is the first electrode 1, and in the phase shift $\phi_2$, the reflection layer is the semi-transmissive layer.

In Equation 1, since $n_1$, $n_2$, $k_1$, and $k_2$ are functions of λ, the phase shift may be expressed as φ(λ).

First, a weighted-averaged emission wavelength of the first light-emitting source 5a is represented as $\lambda_1$, and a weighted-averaged emission wavelength of the second light-emitting source 5b is represented as $\lambda_2$. Here, the weighted-averaged emission wavelength is a wavelength that is derived using an integration of a spectrum that is obtained by measuring an intensity spectrum (emission spectrum) of an emission wavelength. To be precise, it is a wavelength shown in Equation 2 below.

$$\lambda_w = \frac{\int_{380}^{780} \lambda * P(\lambda) d\lambda}{\int_{380}^{780} P(\lambda) d\lambda} \quad (2)$$

In Equation 2, λ is a wavelength (nm), and P(λ) represents the spectrum intensity at the wavelength.

The emission spectrum to obtain the weighted-averaged emission wavelength may be a spectrum in a visible light range. Although the emission wavelength may be, naturally, an emission peak wavelength (wavelength at which the intensity of the emission spectrum takes the maximum value) by using the weighted-averaged emission wavelength, design accuracy can be further improved.

Then, a phase shift which is caused by reflection at the first electrode 1 with regard to the light emitted from the first light-emitting source 5a may be represented as $\phi_1(\lambda_1)$. Similarly, a phase shift which is caused by reflection at the semi-transmissive layer with regard to the light emitted from the first light-emitting source 5a may be represented as $\phi_2(\lambda_1)$. Similarly, a phase shift which is caused by reflection at the semi-transmissive layer with regard to the light emitted from the second light-emitting source 5b may be represented as $\phi_2(\lambda_2)$.

Then, with using these parameters, X, Y, and Z are expressed as following equations.

$$X = \phi_1(\lambda_1) * (\lambda_1/4\Pi) + (\lambda_1 * l/2)$$

$$Y = \phi_2(\lambda_2) * (\lambda_2/4\Pi) + (\lambda_2 * m/2)$$

$$Z = (\phi_1(\lambda_1) + \phi_2(\lambda_1)) * (\lambda_1/4\Pi) + (\lambda_1 * n/2)$$

In the above equations, l, m, and n are integers of 0 or more, respectively. Note that, this "n" differs from reference sign n that represents the refractive index.

Further, an optical path length defined as a product of a refractive index at the wavelength $\lambda_1$ and a thickness with regard to a medium situated between the first light-emitting source 5a and the first electrode 1 is represented as $D_1(\lambda_1)$. Similarly, an optical path length defined as a product of a refractive index at the wavelength $\lambda_1$ and a thickness with regard to a medium situated between the first light-emitting source 5a and the semi-transmissive layer (first interlayer 3a) is represented as $D_2(\lambda_1)$. Similarly, an optical path length defined as a product of a refractive index at the wavelength $\lambda_2$ and a thickness with regard to a medium situated between the second light-emitting source $5b$ and the semi-transmissive layer (first interlayer $3a$) is represented as $D_3(\lambda_2)$. Here, it is preferable that these parameters are set so as to satisfy the relations:

$$0.9*X \leq D_1(\lambda_1) \leq 1.1*X,$$

$$0.1*Y \leq D_3(\lambda_2) \leq 2.0*Y, \text{ and}$$

$$0.8*Z \leq D_1(\lambda_1) + D_2(\lambda_1) \leq 1.2*Z.$$

By setting $D_1(\lambda_1)$, $D_2(\lambda_1)$, and $D_3(\lambda_2)$ to satisfy these relations, in an organic electroluminescent element with the multiunit structure, light intensity of specific direction can be increased by the microcavity effect.

Here, l, m, and n in the above equations of X, Y, and Z represent independent integers. The above equations relating to the optical path length may be set to be satisfied when l, m, and n each take some integer. For example, l, m, and n may be the same integer such as l=m=n=0, l=m=n=1, or l=m=n=2. Alternatively, it may be that m and n are the same integer and l is different such as l=1 and m=n=0, or, l=2 and m=n=1. Obviously, l, m, and n may all be different integers such as l=2, m=0, and n=1. Also, the three integers may satisfy the relation of l≥n≥m. Although the upper limit of each of l, m, and n is not particularly specified, it may be 10.

Note that an optical path length of a medium situated between the face of the second electrode 2 close to the outcoupling side and the second light-emitting source $5b$ is represented as $D_4(\lambda_1)$ when the wavelength is $\lambda_1$, and as $D_4(\lambda_2)$ when the wavelength is $\lambda_2$. Since the second electrode 2 has optical transparency and may be composed of a material that includes an organic substance, the range of $D_4$ is set such that the second electrode 2 is included in a partial region of the organic electroluminescence element defined by $D_4$. Similarly, an optical path length of a medium situated between the second light-emitting source $5b$ and the semi-transmissive layer (first interlayer $3a$) is represented as $D_3(\lambda_1)$ when the wavelength is $\lambda_1$. An optical path length of a medium situated between the semi-transmissive layer (first interlayer $3a$) and the first light-emitting source $5a$ is represented as $D_2(\lambda_2)$ when the wavelength is $\lambda_2$. An optical path length of a medium situated between the first light-emitting source $5a$ and the first electrode 1 is represented as $D_1(\lambda_2)$ when the wavelength is $\lambda_2$.

Although a phase shift which is caused by reflection at the first electrode 1 with regard to the light emitted from the second light-emitting unit $6b$ may be represented as $\phi_1(\lambda_2)$, this phase shift $\phi_1(\lambda_2)$ may not be particularly used in the above embodiment.

Here, $D_1$ to $D_4$ with regard to each of wavelengths of $\lambda_1$ and $\lambda_2$ may be obtained by using the following general equation relating to an optical path length (optical film thickness).

$$D = n*d$$

(In the above equation, n and d represent a refractive index and a thickness (physical thickness), respectively.)

Therefore, for example, the optical path length $D_1$ may be obtained as a product of the refractive index and the thickness of the first charge auxiliary layer $7a$. The optical path lengths $D_1$ to $D_3$ may be obtained similarly.

Ideally, $D_1(\lambda_1)$, $D_2(\lambda_1)$, and $D_3(\lambda_2)$ are set such that $D_1(\lambda_1)=X$, $D_3(\lambda_2)=Y$, and $D_1(\lambda_1)+D_2(\lambda_1)=Z$. However, since light interference occurs even with a small deviation, the microcavity effect can be exhibited sufficiently even in a case where the optical path lengths are set in a range around an ideal setting value as follows. Specifically, since $D_3(\lambda_2)$ has small impact on the effect, the thickness thereof can take a wide range of values excluding extremely large or small values, and as a result the following range has been derived. In order to obtain the microcavity effect, $D_1(\lambda_1)$, $D_2(\lambda_1)$, and $D_3(\lambda_2)$ are preferably in the range of ±10% (range of 90% to 110%) of the above ideal setting values. This range is more preferably ±5% of the ideal setting values (in a range of $0.95*X \leq D_1(\lambda_1) \leq 1.05*X$ for $D_1(\lambda_1)$, for example), and is furthermore preferably ±3% of the ideal setting values. An example of a preferable range of the optical path lengths is as follows.

$$0.9*X \leq D_1(\lambda_1) \leq 1.1*X;$$

$$0.9*Y \leq D_3(\lambda_2) \leq 1.1*Y; \text{ and}$$

$$0.9*Z \leq D_1(\lambda_1) + D_2(\lambda_1) \leq 1.1*Z.$$

Incidentally, although the light-emitting sources 5 are distributed in the light-emitting layer 4, it may be calculated in the above relations supposed that the light-emitting sources 5 are located in the middle of the light-emitting layer 4 in the thickness direction. That is to say, calculations may be carried out, provided that the first light-emitting sources $5a$ are located in the middle of the first light-emitting layer $4a$ in the stacking direction and the second light-emitting sources $5b$ are located in the middle of the second light-emitting source $5b$ in the stacking direction. Alternatively, when the light-emitting layer 4 is sufficiently thin compared with the adjacent charge auxiliary layer 7, the optical path length may be calculated, supposed that the location of the interface between the light-emitting layer 4 and the charge auxiliary layer 7 adjacent to this light-emitting layer 4 is the location of the light-emitting sources 5 with the thickness of the light-emitting layer 4 being disregarded. That is to say, in the above relations, the locations of the light-emitting sources 5 may be considered to be aligned in the stacking direction. Obviously, regarding the light-emitting sources 5 at any position in the light-emitting layer 4, all of the above relations may be satisfied. Similarly, regarding the semi-transmissive layer (first interlayer $3a$), when the semi-transmissive layer is sufficiently thin compared with the charge auxiliary layer 7, the element can be designed with the thickness of the semi-transmissive layer being ignored. FIGS. 1 and 2 illustrate a state in which the optical path lengths $D_1$, $D_2$, $D_3$, and $D_4$ are set in the condition in which the light-emitting source 5 is set to be located in the middle of the light-emitting layer 4 and the location of the first layer $3a$ is considered as the center position of the thickness of the first interlayer $3a$, with the thickness thereof being ignored.

Other exemplary embodiments of the organic electroluminescent element are shown in FIGS. 3 to 6. In these embodiments, a light diffusion layer 9 is provided at a light outcoupling side (outside) from the second electrode 2. In the embodiment shown in FIG. 3, in addition to the configuration in FIG. 1, the light diffusion layer 9 is provided at the outcoupling face of the substrate 8. Other configurations are similar to those of the embodiment in FIG. 1. In the embodiments shown in FIGS. 4 and 5, in addition to the configuration in FIG. 1, the light diffusion layer 9 is provided between the second electrode 2 and the substrate 8. Other configurations are similar to those of the embodiment in FIG. 1. In the embodiment shown in FIG. 6, in addition to the configuration of the embodiment in FIG. 2, a transparent resin layer 10 is provided at the outcoupling face of the second electrode 2 and the light diffusion layer 9 is provided at the outcoupling face side of the transparent resin layer 10. Other configurations are similar to those of the embodiment in FIG. 2.

When a thickness design is carried out with using the above equations, light that enters the interface at a relatively shallow angle and is not put into a waveguide mode increases by the microcavity effect so that light that is extracted to the air may be relatively increased. However, when the light interference provided by the microcavity effect is utilized, while the emitted light intensity at a specific wavelength and an angle is increased, emitted light at other wavelengths and angles becomes extinct or attenuates and thus light-emission is made to have angular distribution, and as a result viewing angle characteristics may degrade. The viewing angle characteristics refer to a size of the viewing angle range in which light-emission can be recognized without uneven color. When the viewing angle characteristics degrade, the viewing angle becomes narrow and the light-emission has angle dependence. That is to say, viewing angle dependence is increased. Thus, it is preferable that the light diffusion layer 9 is provided as shown in the embodiments in FIGS. 3 to 6 as a method to suppress the degradation of viewing angle characteristics while using the microcavity effect.

When the light diffusion layer 9 is provided, the light diffusion layer 9 is preferably situated at the outcoupling face side of the second electrode 2, as shown in FIGS. 3 to 6. Accordingly, without hampering the microcavity effect, light that is diffused by the light diffusion layer 9 can be extracted. When the light diffusion layer 9 is formed inside of the first light-emitting unit 6a or the second light-emitting unit 6b, or at the surface of the second electrode 2 or the interlayer 3, a trade-off with the microcavity effect occurs. When the light diffusion layer 9 is provided on the surface of the substrate 8, it may be formed by processing the substrate 8 or may be formed by stacking a material that constitutes the light diffusion layer 9 on the substrate 8.

In this case, it is preferable that the optical path length ($D_d(\lambda_1)$) between the face of the light diffusion layer 9 close to the outcoupling side and the semi-transmissive layer (first interlayer 3a) at the wavelength $\lambda_1$ is ten times or more as long as the emission peak wavelength $\lambda_1$ of the first light-emitting unit 6a. Due to having this relation, incoherency increases and the microcavity effect and the diffusion become less associated with each other. Here the wavelength ($\lambda_1$) may be the emission peak wavelength. Obviously, the wavelength ($\lambda_1$) may be the weighted-averaged emission wavelength. This can be expressed as the following relation: ($D_d(\lambda_1)$)>10$\lambda_1$.

Note that ($D_d(\lambda_1)$) has no specific upper limit, but it may be 100 times of $\lambda_1$ or less, for example. Incidentally, the letter "d" suffixed to D in $D_d$ is the initial character of diffusion.

If the above equation is satisfied, the viewing angle characteristics can be further improved by the scattering effect by the light diffusion layer 9, and the light-emission angle dependence can be further reduced, while the microcavity effect is maintained.

Incidentally, the optical path length between the face of the second electrode 2 close to the outcoupling side and the second light-emitting source 5b is represented as $D_4(\lambda_1)$ when the wavelength is $\lambda_1$, and the optical path length between the second light-emitting source 5b and the semi-transmissive layer (first interlayer 3a) is represented as $D_3(\lambda_1)$ when the wavelength is $\lambda_1$. The sum ($D_3(\lambda_1)+D_4(\lambda_1)$) is not specifically limited, but it may be 10 times or more of the emission peak wavelength ($\lambda_1$) of the first light-emitting unit 6a.

Figure 3:
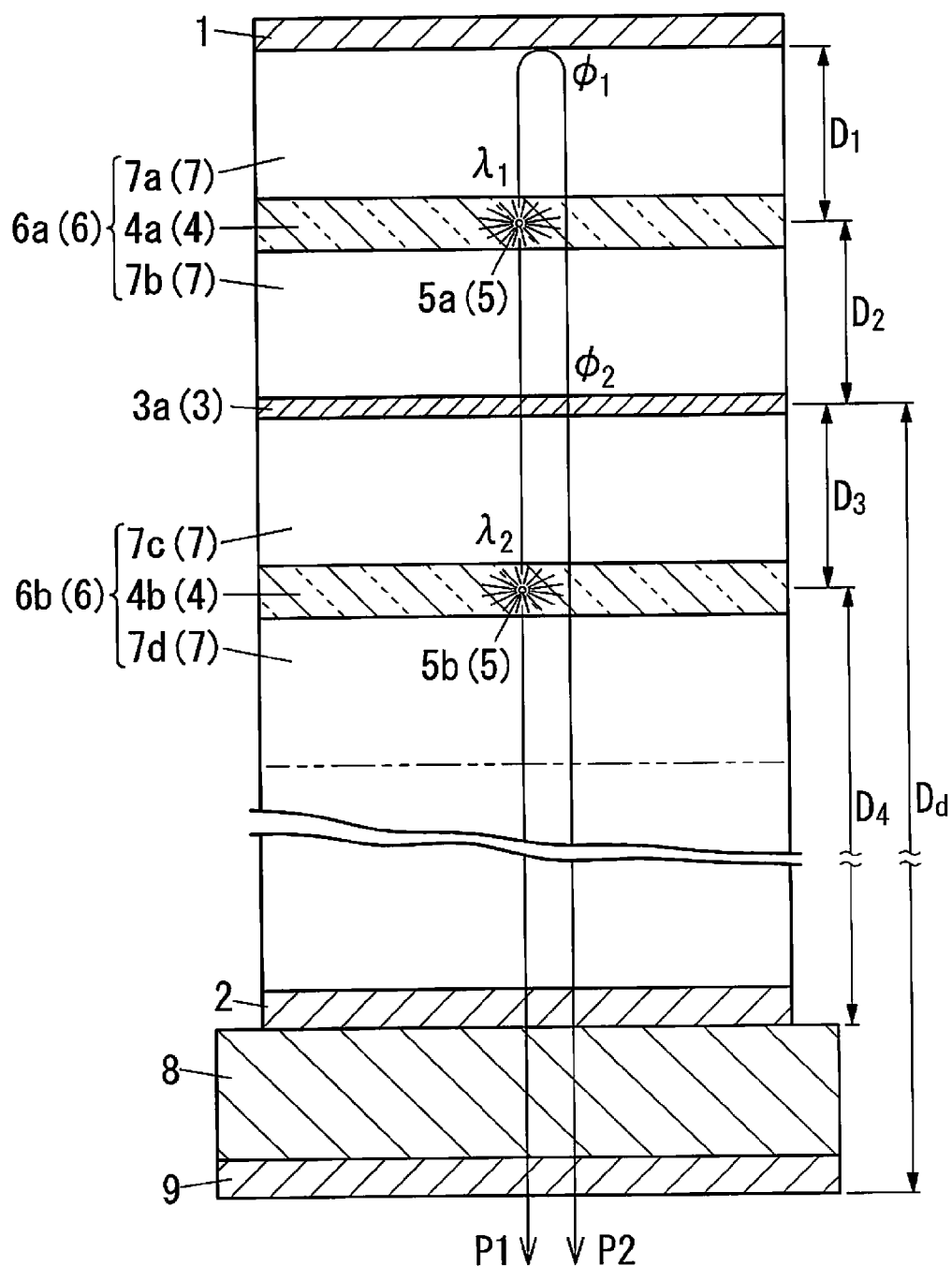
FIG. 3 is a schematic cross-section illustrating an example of an embodiment of the organic electroluminescent element.

In a case of a bottom emission type structure shown in FIG. 3, by forming the light diffusion layer 9 outside of the substrate 8, an effect to improve the viewing angle characteristics can be exhibited while the microcavity effect is maintained. In this embodiment, it is possible that light that arrives at the substrate 8 is increased by the microcavity effect so as to reduce a thin film waveguide mode and light is efficiently extracted from the substrate 8. Since the substrate 8 is sufficiently thick compared with the light wavelength (in the drawings, an outline of the layer structure is shown, and in actuality the substrate 8 is thick), the light that has been angle-changed at the interface between the substrate 8 and the air does not interfere, when the light returns inside, with the light that is increased by the microcavity effect. Thus, the phenomenon in which the light diffusion effect and the microcavity effect are not related to each other and exhibit effects independently is referred to as incoherence. Note that the embodiment in FIG. 3 has, since the light diffusion layer 9 is provided outside, an advantage in that the light diffusion layer 9 can be formed easily compared with the other embodiments.

In the embodiment in FIG. 3, the light diffusion layer 9 is formed on the surface of the substrate 8. With this configuration, the substrate 8 of which the thickness can be easily increased can be arranged between the light diffusion layer 9 and the semi-transmissive layer. Therefore, it is possible to easily set the optical path length ($D_d(\lambda_1)$) between the face of the light diffusion layer 9 close to the outcoupling side and the semi-transmissive layer such that the optical path length ($D_d(\lambda_1)$) is 10 times or more of the emission peak wavelength ($\lambda_1$) of the first light-emitting unit 6a.

Figure 6:
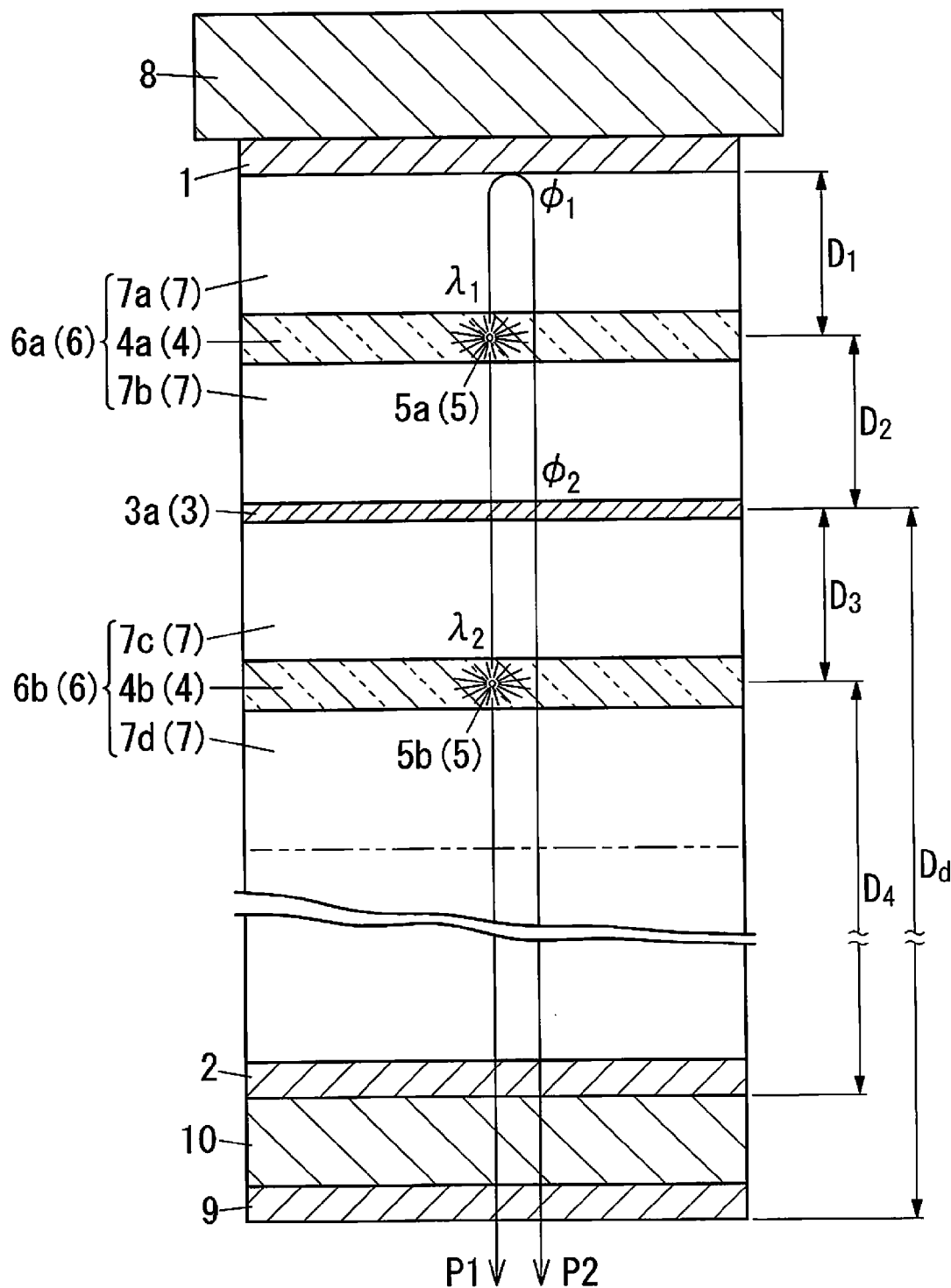
FIG. 6 is a schematic cross-section illustrating an example of an embodiment of the organic electroluminescent element.

In a top emission structure in FIG. 6 also, similar effects can be obtained by the light diffusion layer 9. The light diffusion layer 9 may be provided in contact with the surface of the second electrode 2, or provided with a transparent resin layer 10 interposed therebetween. However, in a case of the top emission structure, it is preferable that the transparent resin layer 10 is formed between the second electrode 2 and the light diffusion layer 9, as shown in FIG. 6, so as to maintain incoherency between the microcavity effect and the diffusion layer 9.

Figure 4:
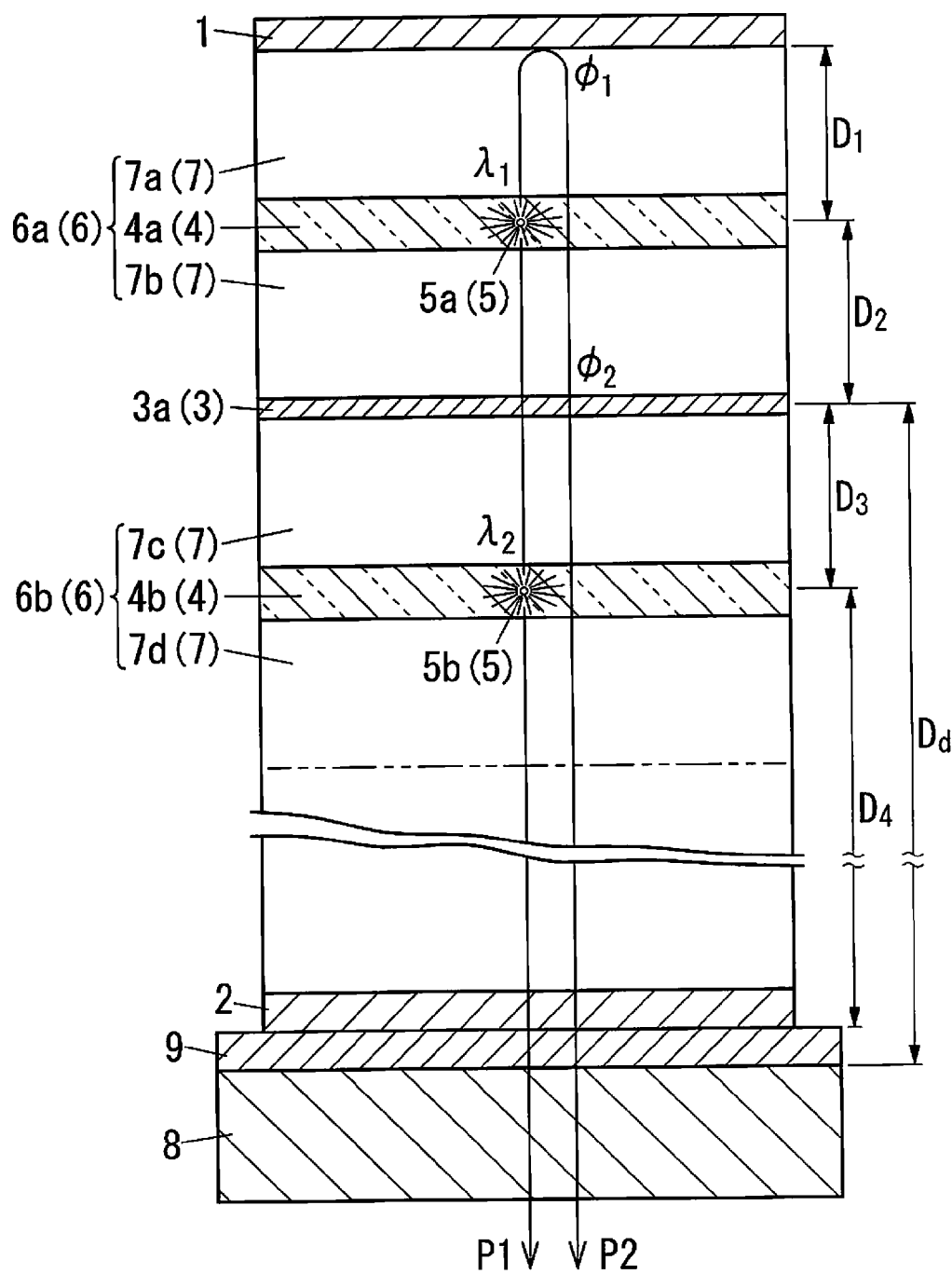
FIG. 4 is a schematic cross-section illustrating an example of an embodiment of the organic electroluminescent element.
Figure 5:
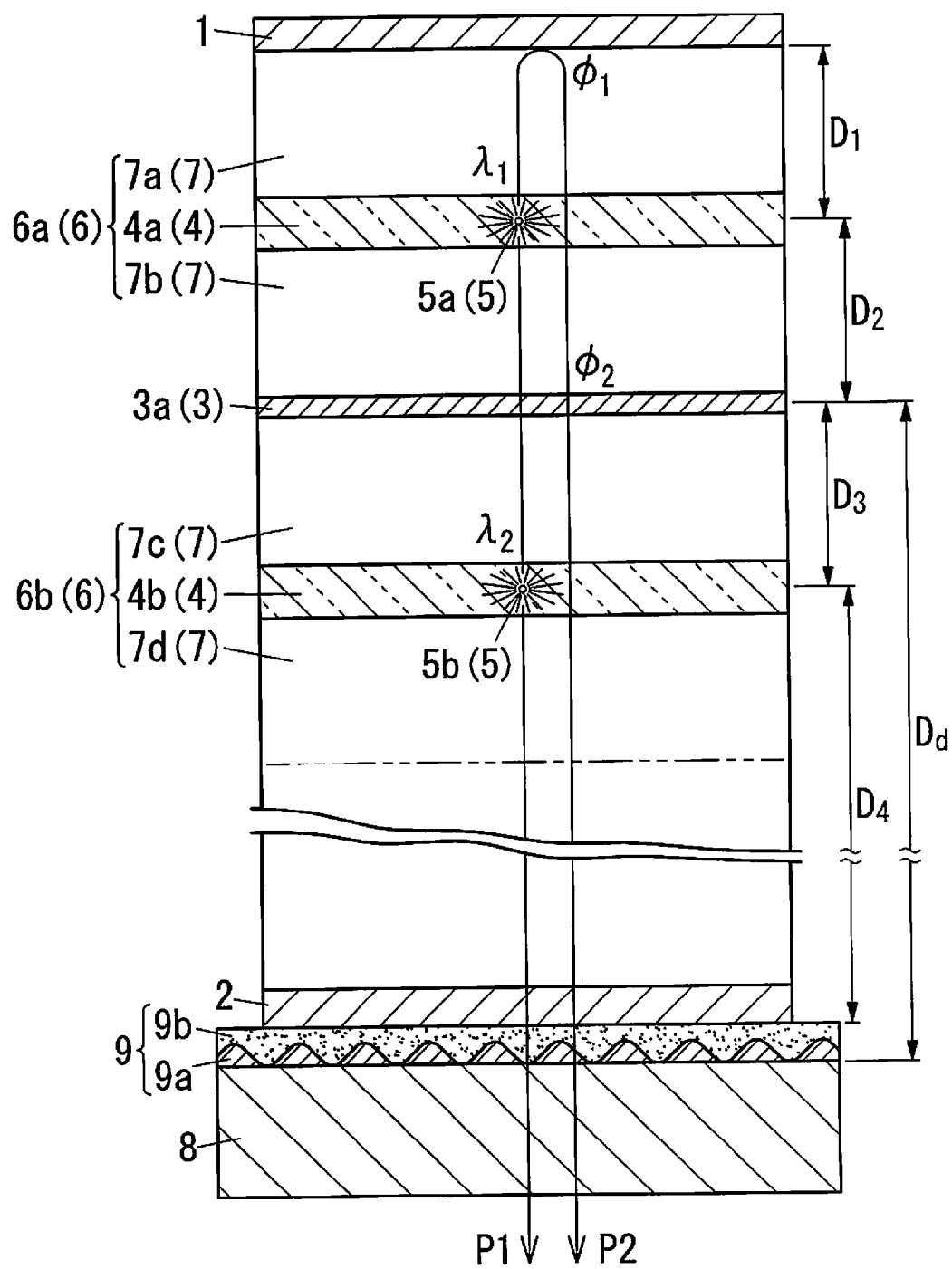
FIG. 5 is a schematic cross-section illustrating an example of an embodiment of the organic electroluminescent element.

In the embodiments in FIGS. 4 and 5, since the light diffusion layer 9 is formed on the inner side of the substrate 8, light before transmission through the substrate 8 can be diffused, and more light can be extracted outside. That is to say, light that otherwise may be lost in the thin film waveguide mode can be extracted, and the light outcoupling property can be improved as a whole.

In the embodiments in FIGS. 3 to 6, the light diffusion layer 9 may be a resin layer formed by mixing highly refractive resin in which metal oxide particles are dispersed and a scattering material, for example. The highly refractive resin has, for example, a refractive index of 1.7 or more. $TiO_2$, for example, may be used as the metal oxide particle. As the scattering material, acrylic particles having a refractive index of about 1.49 may be used. Similarly, instead of the scattering material or in addition to the scattering material, vacancies may be included. The light diffusion layer 9 may be formed by making unevenness on a surface of the substrate 8. For example, the light diffusion layer 9 may be prepared by forming an uneven structure on the surface of the substrate 8 with an ultraviolet curable resin having a refractive index of about 1.5 by imprinting the ultraviolet curable resin thereon and stacking a highly refractive resin described above thereon.

In the embodiment in FIG. 4, the light diffusion layer 9 may be composed of a resin layer that is formed of a mixture of a scattering material and highly refractive resin in which metal oxide particles are dispersed. In the embodiment in FIG. 5, an uneven layer 9a having an asperity face is formed on the face of the substrate 8 close to the light-emitting source 5, and a planarizing layer 9b is formed on the surface of the uneven layer 9a to provide a flat surface of the light diffusion layer 9.

The light diffusion layer 9 is thereby configured by the uneven layer 9a and the planarizing layer 9b.

Figure 7:
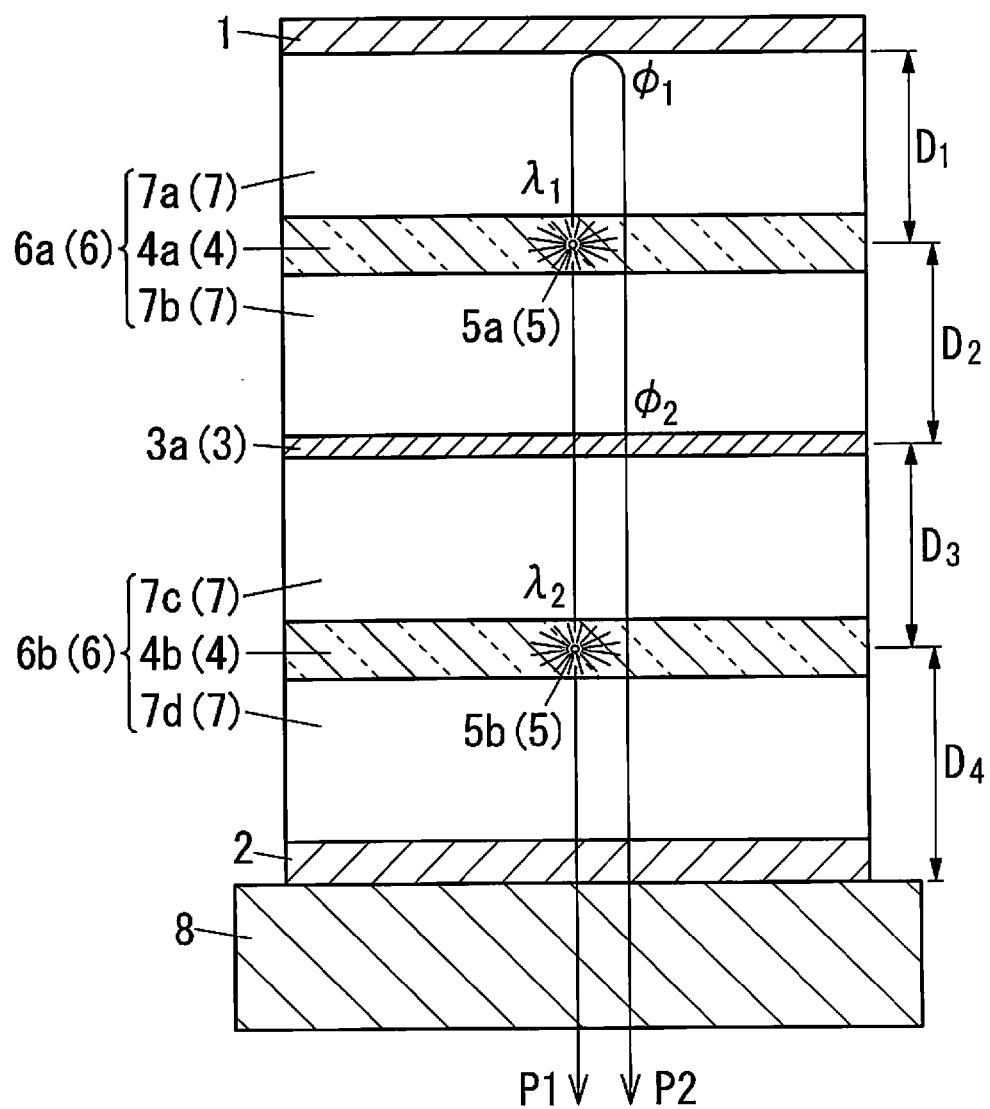
FIG. 7 is a schematic cross-section illustrating an example of an embodiment of the organic electroluminescent element.

FIG. 7 illustrates an exemplary embodiment of an organic electroluminescent element. This element has two light-emitting units 6 and one interlayer 3 (first interlayer 3a) interposed between the light-emitting units 6. The element having such a multiunit structure with two light-emitting units 6 is more basic, and is more useful because the multiunit structure with two light-emitting units 6 is a simpler structure.

In the organic electroluminescent element, when the substrate 8 having optical transparency is provided on the outcoupling face of the second electrode 2, the substrate 8 preferably has a refractive index of 1.55 or more. Specifically, this kind of design is preferable when the relation of $D_d(\lambda_1)>10\lambda_1$ is satisfied. Accordingly, in addition to extraction by the cavity effect, more of the light that may have entered in the substrate waveguide mode and the thin film waveguide mode can be extracted, and as a result the light outcoupling property can be further improved. This kind of stacked structure of the element is described above as the bottom emission structure.

Figure 8A:
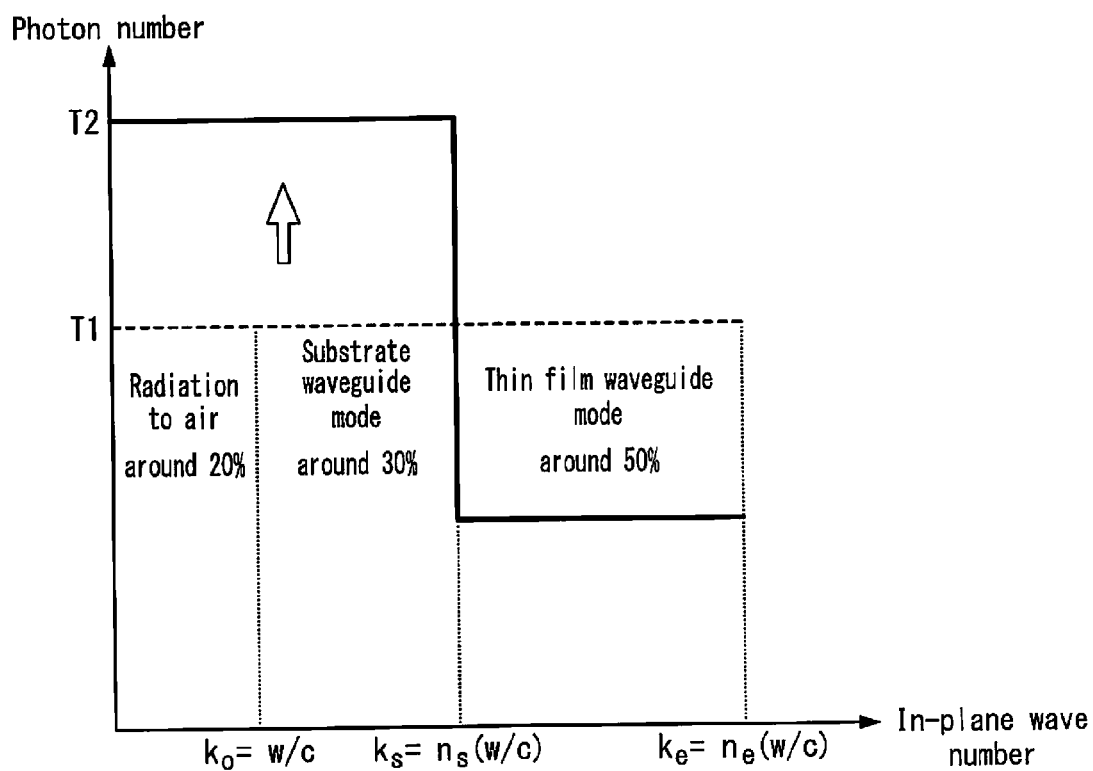
FIG. 8A is an illustrative diagram illustrating a function of the organic electroluminescent element.
Figure 8B:
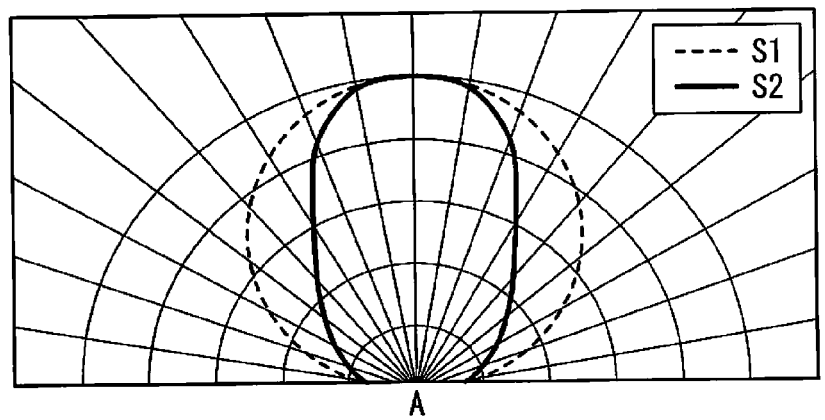
FIG. 8B is an illustrative diagram illustrating a function of the organic electroluminescent element.

Improvement of the light outcoupling property for the organic electroluminescent element having the microcavity structure will be described with reference to FIGS. 8A and 8B. In FIGS. 8A and 8B, parameters relating to the light outcoupling property specifically in an element with the bottom emission structure are illustrated. FIG. 8A is a schematic graph that illustrates the relation between in-plane wavenumber of light and the number of photons. The ratio of light that is extracted outside and radiated toward the air to the light that is produced inside is about 20%. The reason why the light outcoupling efficiency is only this degree is that light that enters interfaces between the substrate and the organic layer (thin film) and between the substrate and the air at a shallow angle is lost as light in the waveguide mode. That is to say, the total reflection occurs at the interface before entering the substrate or before propagating to the air, and as a result light cannot be extracted. However, in the organic electroluminescent element having the microcavity structure, distribution of the light has been changed due to the microcavity effect and intensity of the light that propagates toward outside is increased. That is to say, the light amount is increased.

FIG. 8B illustrates schematically an orientation distribution of emitted light that arrives at the substrate. The light that has arrived at the substrate has such directivity that most of light rays travel forward from point A (upper side in drawing). In a normal element, as shown by S1, light has directivity in a shape of circle or laterally long ellipse. However, in the organic electroluminescent element having the microcavity structure, directivity of light is changed as shown by S2, and the light may have directivity in a shape of vertically long ellipse. Due to changing the directivity of light as shown above, more light can enter inside of the substrate.

As shown in FIG. 8A, in the normal element, without being extracted outside, about 50% of light is lost due to the thin film waveguide mode, and about 30% of light is lost due to the substrate waveguide mode. Here, as shown by T1, the number of photons with respect to the in-plane wavenumber is constant and can be expressed as a line. On the other hand, in the microcavity structure, since more light can enter into the substrate, light to be otherwise lost due to the thin film waveguide mode can be reduced, and the light to be otherwise lost can be converted into the substrate waveguide mode and light to be radiated to the air, as shown by T2. Then, the amount of light radiated to the air and the substrate waveguide mode is increased as a whole. Therefore, although the substrate waveguide mode still exists, amount of light that is radiated to the air is increased compared with the normal element. Thus, due to the microcavity effect, the light outcoupling property can be improved. When the light diffusion layer 9 is provided, since a part of light to be otherwise lost as the substrate waveguide mode can be extracted, more improved light outcoupling property can be obtained along with improved viewing angle characteristics.

Figure 9:
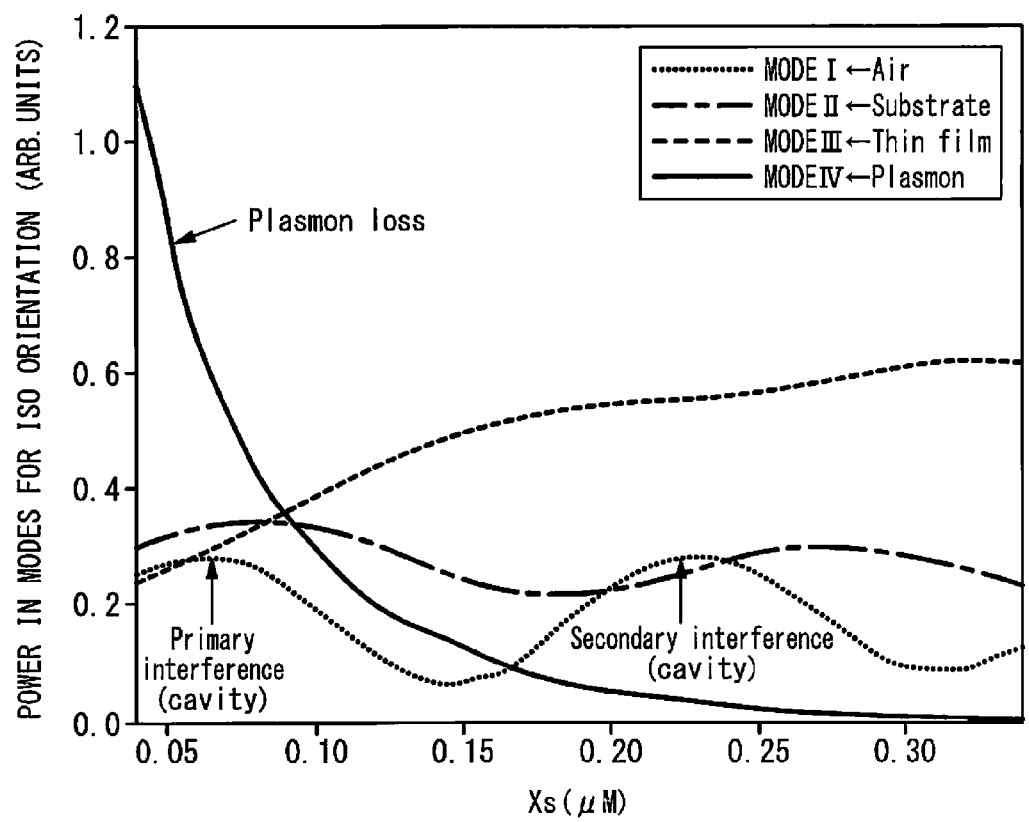
FIG. 9 is a graph showing a light outcoupling property with respect to a thickness change of a film between a light-emitting source and a reflection layer.

An effect of suppressing plasmon loss will be described with reference to FIGS. 9 to 11. FIG. 9 is a graph illustrating light outcoupling property with respect to thickness variation of the film between the light-emitting source and the reflection layer. This graph shows modes in which light is lost. MODE I represents an air mode, and shows interference characteristics of light that is extracted to outside (the air). MODE II, MODE III, and MODE IV are a substrate mode, a thin film mode, and plasmon mode, respectively, and represent light that is confined inside of the element and cannot propagate outside. The waveform of MODE I shows film thickness dependence due to interference. Primary interference and secondary interference in the cavity, in order of increasing thickness, are confirmed. Here, at the film thickness of the primary interference, the light outcoupling property as a whole may degrade due to a large plasmon loss. Therefore, a structure in which the secondary interference occurs and the plasmon loss is suppressed is preferred. Due to the effect of suppressing the plasmon loss, efficiency improvement can be expected. However, in the higher order of interference (tertiary interference, fourth interference, . . . ) than the secondary interference (second cavity (2nd cavity)), the efficiency may rather degrade due to the radiation lifetime becoming longer.

Figure 10:
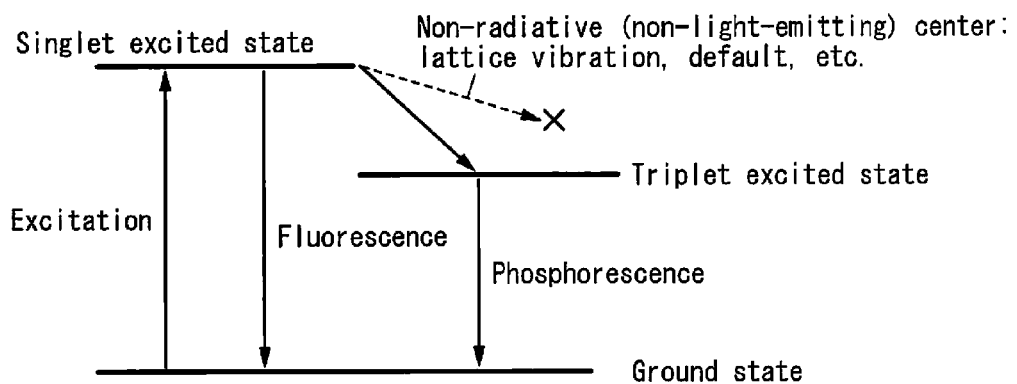
FIG. 10 is a schematic graph showing energy changes at light-emission.

FIG. 10 is a schematic graph illustrating energy change at the time of light emission. Typical energy change in the light emission is shown by the solid arrow, that is to say, light is generated when electrons that are excited to an energy level of the singlet excited state from an energy level of the ground state return to the ground state. Fluorescence is a phenomenon in which light is generated when electrons at the singlet excited state directly return to the ground state. Phosphorescence is a phenomenon in which light is generated when electrons that are transited to the triplet excited state from the singlet excited state return to the ground state. Here, electrons may take a path to a non-radiative (non-light-emitting) center shown by the dotted arrow, due to the influence of lattice vibration, a defect or the like, and therefore appropriate light-emission may not be obtained. Therefore, film thickness design is important.

Light-emission efficiency n is expressed by the following equation;

$$\eta_{rad} = \frac{F\Gamma r}{F\Gamma r + \Gamma nr}.$$

In the above equation, F is a lifetime factor. $\Gamma r$ and $\Gamma nr$ represent emitting probability and non-emitting probability, respectively. Letter "r" suffixed to $\Gamma$ is the initial character of "radiative", and "nr" is the initial characters of "non-radiative".

The longer the lifetime factor F is, a light-emission lifetime tends to be shorter but the efficiency tends to be larger. The carrier lifetime and the light-emission (radiative recombination) efficiency are normally, as represented by the next equation, in an inversely proportional relationship;

$$\frac{1}{\tau} = \Gamma = F\Gamma r + \Gamma nr.$$

In the above equation, τ represents the carrier lifetime, and Γr and Γnr represent the emitting probability and the non-emitting probability, respectively.

Figure 11:
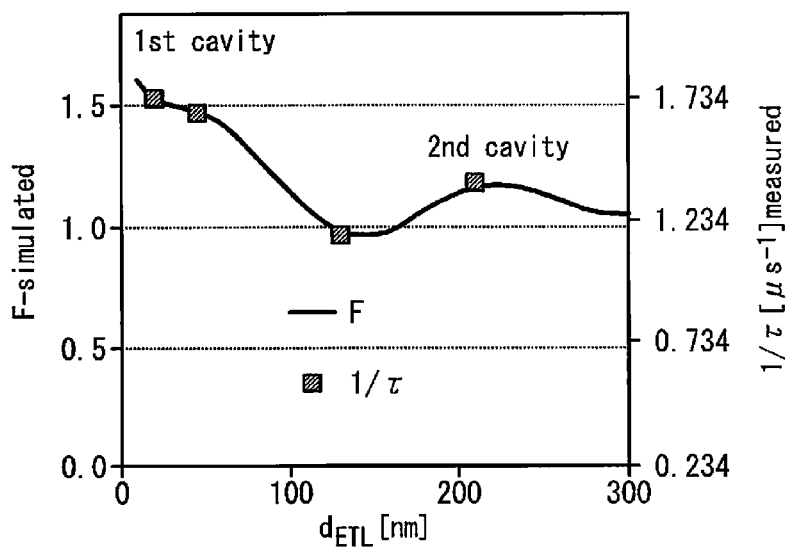
FIG. 11 is a graph representing a relation between a thickness change (d) and a lifetime factor (F)

FIG. 11 is a graph showing the lifetime factor F with respect to the thickness variation. That is to say, due to the microcavity effect, the carrier lifetime changes and radiation efficiency (IQE) changes (increases/decreases). At the 2nd cavity mode, factor F decreases, and therefore the efficiency decreases. Therefore, at the 2nd cavity mode, there is a trade-off between the suppression of the aforementioned plasmon loss and decrease in the efficiency due to the decrease of factor F. However, in the organic electroluminescent element of the present embodiment, due to using semi-transmissive material as the interlayer, a high microcavity effect is maintained even in the 2nd cavity mode. Therefore, since improvement of the factor F is expected, improvement of the efficiency due to suppressing the plasmon loss is expected.

Here, as described above, in the organic electroluminescent element of the present embodiment, a preferable range of the optical path lengths $D_1(\lambda_1)$, $D_3(\lambda_2)$, and $D_1(\lambda_1)+D_2(\lambda_1)$ can be expressed by using X, Y, and Z, and X, Y, and Z are represented by the following equations:

$$X=\phi_1(\lambda_1)*(\lambda_1/4\Pi)+(\lambda_1*l/2);$$

$$Y=\phi_2(\lambda_2)*(\lambda_2/4\Pi)+(\lambda_2*m/2);\text{ and}$$

$$Z=(\phi_1(\lambda_1)+\phi_2(\lambda_1))*(\lambda_1/4\Pi)+(\lambda_1*n/2).$$

In the above equations, l, m, and n are integers of 0 or more, respectively.

In the equation for X, it is preferable that l is not less than 1. Accordingly, $D_1$ is in a range in which the second cavity mode or a higher order of cavity mode occurs, and since the plasmon loss can be suppressed. Hence, the light outcoupling property can be improved. Since a strong cavity effect remains, maintaining of the effect of decreasing light-emission lifetime (increasing efficiency) can be expected.

Furthermore, in the equations for X, Y, and Z, it is further preferable that l, m, and n are not less than 1, respectively. In this case, $D_1$, $D_2$, and $D_3$ are in a range in which the second cavity mode or a higher order of cavity mode occurs, and since the plasmon loss can be suppressed almost completely, the light outcoupling property can be further improved. Since a strong cavity effect remains, maintaining of the effect of decreasing light-emission lifetime (increasing efficiency) can be expected. In order to further balance between the cavity effect and the plasmon loss suppressing effect, specifically, it is preferable to have a structure (second cavity structure) in which the second cavity mode dominates, and in such a case, l is preferably to be 1. Similarly, from the viewpoint of the second cavity structure, it is further preferable that l, m, and n are 1, respectively.

Incidentally, in each of above embodiments, regarding materials for the first electrode 1, the second electrode 2, the charge auxiliary layers 7a, 7b, 7c, and 7d, the light-emitting layers 4a and 4b, and the substrate 8, appropriate materials usually used for those of an organic electroluminescent element are used. For example, as a material for the second electrode 2, ITO, IZO, tin oxide, zinc oxide, copper iodide, or the like, an electrically-conductive polymer such as PEDOT, or polyaniline, an electrically-conductive polymer that is doped with an arbitrary acceptor or the like, and a conductive optical transparent material such as a carbon nanotube may be used.

Preferred examples of material for the first electrode 1 include an electrode material with small work function such as a metal, an alloy, an electrically-conductive compound, and a mixture of these materials, which have small work function. It is preferable to use a material for the first electrode 1 having a work function of 1.9 eV or more and 5 eV or less so that the difference from the LUMO (Lowest Unoccupied Molecular Orbital) level is not too large. As such an electrode material, for example, aluminum, silver, magnesium, and the like, and an alloy of these metals and the other metals, such as magnesium-silver mixture, magnesium-indium mixture, aluminum-lithium alloy can be listed. Similarly, a stacked film formed by an extremely thin film (here, a thin film with a thickness of 1 nm or less such that electrons flow therethrough by tunnel injection) and an aluminum thin film can be used. The extremely thin film is made of a metal conductive material, a metal oxide, or the like, or a mixture of these materials with another metal such as aluminum oxide.

As a material for the light-emitting layer 4, an arbitrary material that is known as a material for that of the organic electroluminescent element can be used. Examples of the material for the light-emitting layer 4 include anthracene, naphthalene, pyrene, tetracene, coronene, perylene, phthaloperylene, naphthaloperylene, diphenylbutadiene, tetraphenylbutadiene, coumalin, oxadiazole, bisbenzooxazoline, bisstyryl, cyclopentadiene, a quinoline metal complex, a tris(8-hydroxyquinolinato) aluminum complex, a tris(4-methyl-8-quinolinato) aluminum complex, a tris(5-phenyl-8-quinolinato) aluminum complex, an aminoquinoline metal complex, a benzoquinoline metal complex, tri-(p-terphenyl-4-yl)amine, a 1-aryl-2,5-di(2-thienyl)pyrrole derivative, pyran, quinacridone, rubrene, a distyrylbenzene derivative, a distyrylarylene derivative, a distyrylamine derivative, various fluorochrome, the above compound-based materials, and derivatives thereof. However, the material for the light-emitting layer 4 is not limited thereto. Furthermore, preferred example of material for the light-emitting layer 4 is mixture of light-emission materials selected from the above compounds appropriately. Similarly, not only compounds that generate fluorescence represented by the above compounds, but materials such as materials that generate light-emission through a multiplet spin state such as a phosphorescent light-emission material that generates phosphorescence and compounds whose molecule includes these materials as a portion may be preferably used. A light-emitting layer composed of at least one of these materials may be formed by a dry process such as a vapor deposition method and a transfer method, or may be formed by a wet process such as a spin coat method, a spray coating method, a dye coating method, or a gravure printing method.

As a material for the charge auxiliary layer 7, appropriate materials in accordance with desired characteristics of layers that constitute the charge auxiliary layer 7 such as a hole-injection layer, a hole-transport layer, an electron-transport layer, an electron-injection layer may be used.

Examples of a material for the hole-injection layer include: a hole injecting organic material and a metal oxide; and an organic material and inorganic material used as material for acceptor; and a p-doped layer. The hole injecting organic material is a material that has hole transportability, a work function of 5.0 to 6.0 eV, and strong adherence to the electrode, and is CuPc, starburst amine, or the like, for example. A hole-injection metal oxide is, for example, a metal oxide that includes any of molybdenum, rhenium, tungsten, vanadium, zinc, indium, tin, gallium, titanium, and aluminum. Not only an oxide of a single metal, it may be a composite metal oxide that include any one of sets including a set of indium and tin, a set of indium and zinc, a set of aluminum and gallium, a set of gallium and zinc, and a set of titanium and niobium. The hole-injection layer made of these materials may be formed by a dry process such as a vapor deposition method, a transfer method, or may be formed by a wet process such as a spin coat method, a spray coating method, a dye coating method, or a gravure printing method.

A material for the hole-transport layer can be selected from a group of compounds with hole transportability. Examples of the compounds with hole transportability include arylamine compounds (e.g., 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4''-tris(N-(3-methylphenyl)N-phenylamino)triphenylamine (MTDATA), 4,4'-N,N'-dicarbazolebiphenyl (CBP), Spiro-NPD, spiro-TPD, spiro-TAD, and TNB), an amine compound that contains a carbazole group, and an amine compound that contains a fluorene derivative. However, an arbitrary hole-transport material that is generally known can be used.

As a material for the electron-transport layer can be selected from a group of compounds with an electron transportability. Examples of the compounds with an electron transportability include a metal complex that is known as an electron transportable material (e.g., $Alq_3$), and a compound having heterocycle (e.g., a phenanthroline derivative, a pyridine derivative, a tetrazine derivative, or an oxadiazole derivative). However, an arbitrary electron transport material that is generally known can be used.

A material for the electron-injection layer is arbitrarily selected from the following examples. Examples of the material for the electron-injection layer include: metal halides such as a metal fluoride (e.g., lithium fluoride and magnesium fluoride) and metal chloride (e.g., sodium chloride and magnesium chloride); and metal oxide; and metal nitride; and metal carbide; and metal oxynitride; and a carbon compound; and a silicon compound (e.g., $SiO_2$ and SiO). Examples of metal for the metal nitride, the metal carbide, and the metal oxynitride include aluminum, lithium, cesium, cobalt, zirconium, titanium, vanadium, niobium, chromium, tantalum, tungsten, manganese, molybdenum, ruthenium, iron, nickel, copper, gallium, zinc, and silicon. More specific examples of the metal nitride, the metal carbide, and the metal oxynitride include a compound to serve as insulators such as aluminum oxide, magnesium oxide, iron oxide, aluminum nitride, silicon nitride, silicon carbide, silicon oxynitride, and boron nitride. These materials can be formed into a thin film by a vacuum vapor deposition method or a sputtering method.

As a material for the substrate 8, a resin substrate, a glass substrate, or the like can be listed. In the above organic electroluminescent element, the microcavity effect can be obtained with various materials including the aforementioned materials.

According to the organic electroluminescent element described above, even with a multiunit structure that has a plurality of light-emitting layers and is capable of achieving higher luminance and longer life, an organic electroluminescent element in which total light flux can be increased while viewing angle dependence is suppressed can be provided. Specifically, the microcavity effect can be utilized by using a metal thin film with a small absorption ratio as the interlayer 3 that is interposed between a plurality of light-emitting layers 4. Moreover, due to optimizing the thickness of each layer, light that is radiated to the air can be increased, and therefore luminance and a total light flux can be increased. Further, due to providing the layer that has light diffusibility without affecting the microcavity effect, viewing angle dependence can be suppressed and light in the substrate waveguide mode can be efficiently extracted. That is to say, as shown in FIGS. 8A to 8D, with the microcavity effect, a part of light in the thin film waveguide mode that usually accounts for 50% of total light is converted into the mode in which light is extracted to the air and into the substrate waveguide mode. Furthermore, with the light diffusion layer 9, a part of the light in the substrate waveguide mode can be extracted outside. Consequently, high light outcoupling efficiency can be achieved. Moreover, as shown in FIG. 9, due to suppressing the plasmon loss, the light outcoupling efficiency can further be increased. The organic electroluminescent element can preferably be used for a planar light emitting apparatus, lighting equipment, or the like.

EXAMPLES

Example 1

In an organic electroluminescent element with the multiunit structure, the element is optimized by setting optical path lengths.

As the organic electroluminescent element, an element having the bottom emission structure with the layer structure shown in FIG. 7 and having two light-emitting units 6 was used. In this element, an anode was formed as the second electrode 2 on a surface of the transparent substrate 8, and the second light-emitting unit 6b and the first light-emitting unit 6a were formed thereon in series interposing the semi-transmissive layer (first interlayer 3a) therebetween. Then, a cathode was formed thereon as the first electrode 1. The first light-emitting unit 6a included the first charge auxiliary layer 7a including the electron-transport layer and the electron-injection layer, the first light-emitting layer 4a, and the second charge auxiliary layer 7b including the hole-injection layer and the hole-transport layer. Similarly, the second light-emitting unit 6b included the third charge auxiliary layer 7c including the electron-transport layer and the electron-injection layer, the second light-emitting layer 4b, and the fourth charge auxiliary layer 7d including the hole-injection layer and the hole-transport layer. The substrate 8 may be made of a glass, for example. The second electrode 2 may be made of ITO or IZO, for example. The first electrode 1 may be made of Al or Ag, for example. The charge auxiliary layers 7 may be composed of organic materials that each has required charge transport/injection characteristics. In a simulation of the present example, materials need not be specified.

The first light-emitting layer 4a was made of a light-emission material that has a different emission peak wavelength from that of a light-emission material of the second light-emitting layer 4b. For example, the first light-emitting layer 4a was formed as an orange light-emitting layer, the second light-emitting layer 4b was formed as a blue light-emitting layer, and as a result the emission light color as a whole is white. In this case, a white organic electroluminescent element with the multiunit structure was obtained.

Generally, an optical path length D can be expressed as a product of a refractive index n and a thickness d of a film. That is to say, D=n*d. Here, when the charge auxiliary layer 7 includes a plurality of layers, such as a layer with a refractive index of $n_1$ and a thickness of $d_1$, a layer with a refractive index of $n_2$ and a thickness of $d_2$, and so on, an optical path length D in the stacking direction can be expressed as a sum of optical path lengths of respective layers, as follows.

$$D = n_1 * d_1 + n_2 * d_2 + \ldots$$

An optical path length calculated in this way is used in the above relations.

In the present example, the emission wavelength $\lambda_1$ of the first light-emitting unit 6a was set to be 600 nm, and the emission wavelength $\lambda_2$ of the second light-emitting unit 6b was set to be 460 nm. These emission wavelengths were the weighted-averaged emission wavelengths. The actual thickness of the first charge auxiliary layer 7a was 80 nm, the actual thickness of the second charge auxiliary layer 7b was 40 nm, the actual thickness of the third charge auxiliary layer 7c was 65 nm, and the actual thickness of the fourth charge auxiliary layer 7d was 275 nm. The thickness of the light-emitting layer 4 was ignored.

An example of a specific device in which the optical path lengths $D_1$ to $D_4$ are set using reflection layers (first electrode 1 and first interlayer 3a) whose phase shifts $\phi_1$ and $\phi_2$ are shown in TABLE 4.

TABLE 4

| Parameter | $\lambda_1$ = 600 nm | $\lambda_2$ = 460 nm |
|---|---|---|
| $\phi_1$ | 150 deg | 120 deg |
| $\phi_2$ | 130 deg | 110 deg |
| $D_1$ | 130 nm | 150 nm |
| $D_2$ | 70 nm | 75 nm |
| $D_3$ | 110 nm | 120 nm |
| $D_4$ | 450 nm | 480 nm |

Figure 13:
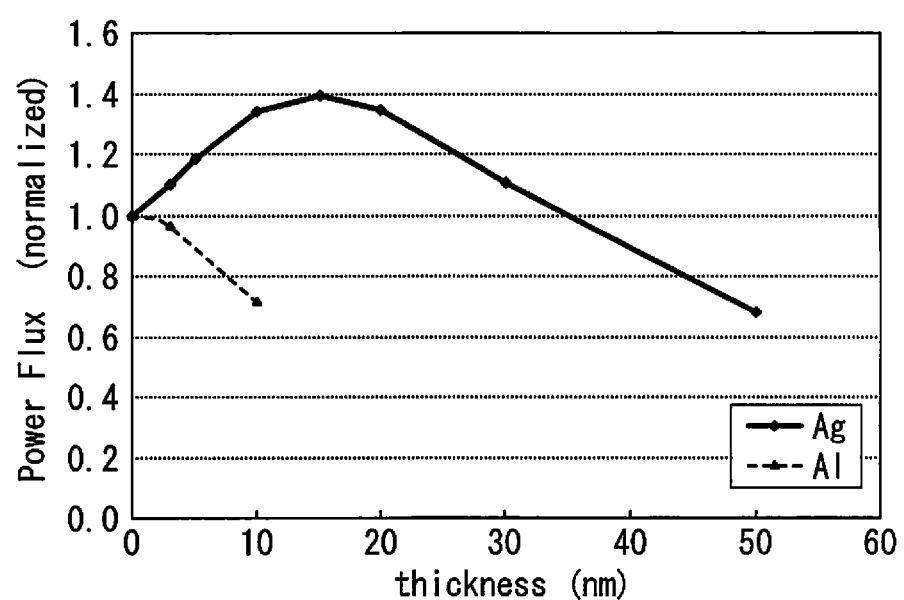
FIG. 13 is a graph showing a relation between a film thickness and light intensity.
Figure 14A:
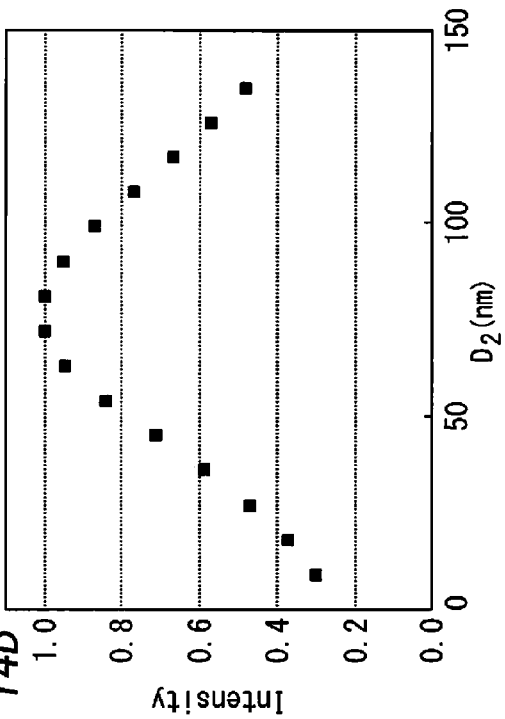
FIG. 14A is a graph showing a relation between an optical path length $D_1(\lambda_1)$ and light intensity.
Figure 14C:
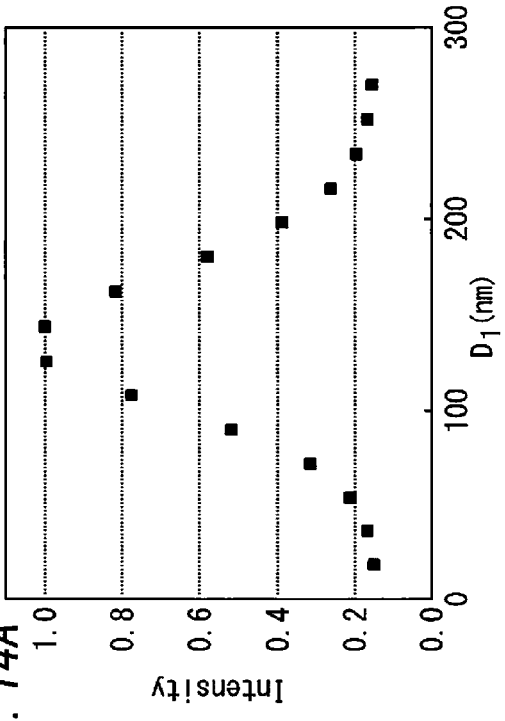
FIG. 14C is a graph showing a relation between an optical path length $D_3(\lambda_2)$ and light intensity.
Figure 14B:
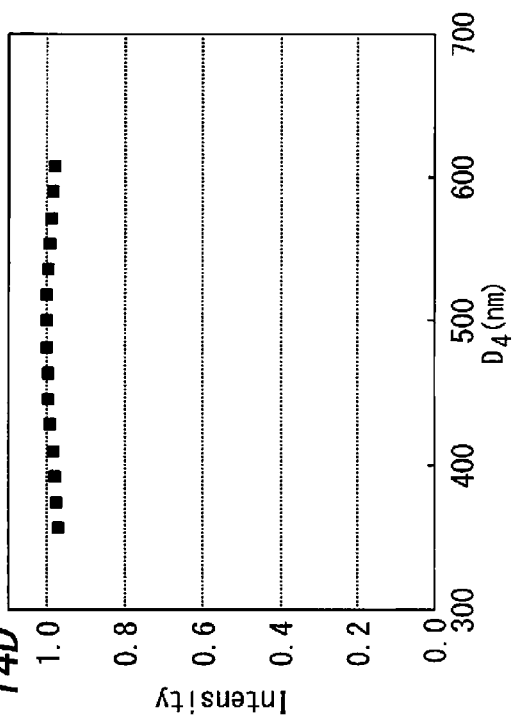
FIG. 14B is a graph showing a relation between an optical path length $D_2(\lambda_1)$ and light intensity.
Figure 14D:
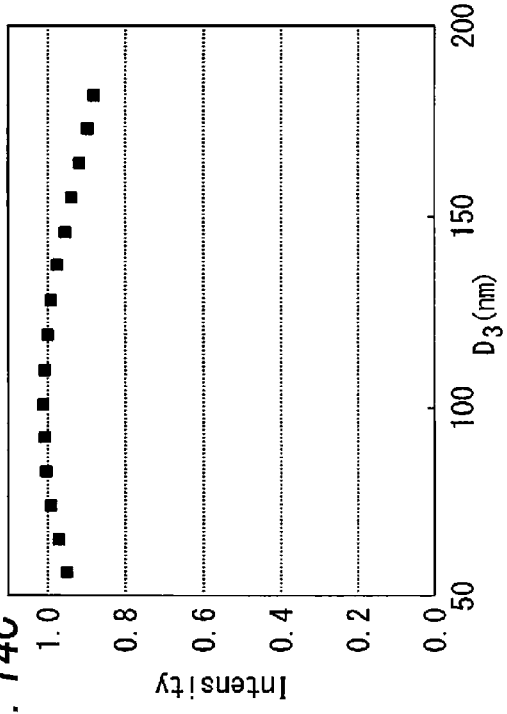
FIG. 14D is a graph showing a relation between an optical path length $D_4(\lambda_2)$ and light intensity.
Figure 15:
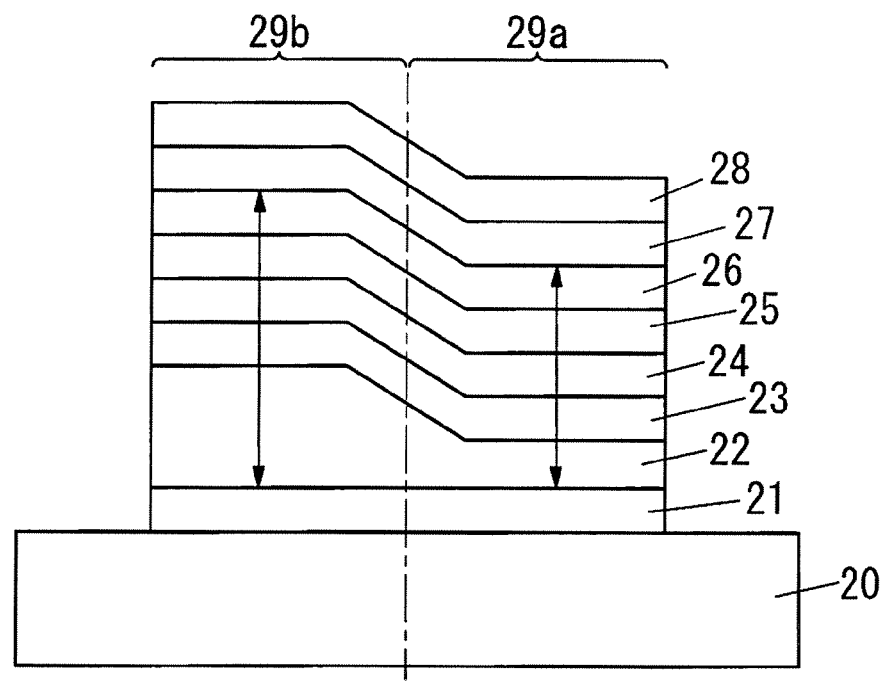
FIG. 15 is a schematic cross-section of an example of a conventional organic electroluminescent element.

FIG. 13 shows a variation of the total radiant flux (total light flux converted in energy) that is emitted outside when the thickness of the semi-transmissive layer (first interlayer 3a) is changed. Also, a variation of the total radiant flux when the material of the interlayer is not Ag but Al is shown.

As seen in Ag film thickness dependence in FIG. 13, the energy value takes the maximum value around a thickness of 15 nm (about 40% at the maximum). The total radiant flux is a calculated energy value for the light in all the emission directions. Therefore, this result cannot be considered as a result from light being intensified in only a specific direction due to a simple microcavity effect that is known conventionally. Instead, it is estimated that, the angular component of light that was conventionally lost through the substrate waveguide mode has decreased by the microcavity effect described above, an angular component of light that is not subjected to the total reflection and is extracted outside increases by the same degree, and as a result radiation energy to the air is supposed to be increased.

On the other hand, in Al thin film, even though interference by the microcavity effect similarly occurs, an energy increase is not seen, but it is observed that the energy decreases with an increase in the thickness. Such difference between Al and Ag shows that the reflectance and the absorption ratio of a metal thin film are strongly related to the light intensity.

Note that, FIG. 13 shows that the energy value decreases below the reference value 1.0(ref) when the Ag thickness is greater than about 35 nm. This shows that the larger the reflectance is, the light outcoupling property degrades more. This result shows that too high reflectance is not preferable.

FIGS. 12A to 12C and TABLES 1 to 3 show characteristics of materials that are preferable for the semi-transmissive layer, as described above. From the results in FIGS. 12A to 12C, TABLES 1 to 3, and FIG. 13, it was confirmed that the transmissivity/absorption ratios of a metal that vary with thickness used for the semi-transmissive layer and the total radiant flux are strongly correlated. That is to say, since Ag has a small absorption ratio and not too high reflectance in a thickness range until about 20 to 30 nm, efficiency improvement can be seen due to the microcavity effect. On the other hand, since Al has a large absorption ratio even in a thin metal film, light absorption dominates rather than the microcavity effect, and as a result the amount of light energy decreases. The superiority of using Ag can be said to be confirmed.

Example 2

In order to confirm a preferable condition of thicknesses, an analysis was conducted with regard to the relation between phase shifts $\phi_1$ and $\phi_2$ at the respective reflections by the cathode and the metal thin film (semi-transmissive layer), wavelengths $\lambda_1$ and $\lambda_2$ of the respective light-emitting layers 4a and 4b, and derived thicknesses $D_1$ to $D_4$.

FIGS. 14A to 14D shows the value of total radiant flux when the optical path lengths (optical film thickness) of $D_1(\lambda_1)$, $D_2(\lambda_1)$, $D_3(\lambda_2)$, and $D_4(\lambda_2)$ were independently changed in an exemplary device shown in TABLE 4 in which Ag thin film of 15 nm is used as the semi-transmissive layer. That is to say, for example, in the graph of $D_2(\lambda_1)$ in FIG. 14B, the light intensity variance due to the change of $D_2(\lambda_1)$ is shown when $D_1(\lambda_1)$, $D_4(\lambda_2)$, and $D_3(\lambda_2)$ are fixed to the values in TABLE 4 in the exemplary device.

In FIGS. 14A to 14D, it can be seen that for $D_1(\lambda_1)$ and $D_2(\lambda_1)$, the light intensity increases/decreases sharply with a variation in the thickness, and the graph thereof shows mountain shaped trajectory having a maximum value. The maximum value of $D_1(\lambda_1)$ is in a range of 100 to 160 nm, and the maximum value of $D_2(\lambda_1)$ is in a range of 60 to 110 nm. As for $D_4(\lambda_2)$, the graph has a flat shape that does not show noticeable increase/decrease relative to the thickness. As for $D_3(\lambda_2)$, the graph has a broad small maximum around 50 to 100 nm. Here, for the optical path lengths $D_4(\lambda_1)$, $D_3(\lambda_1)$, $D_2(\lambda_2)$, and $D_1(\lambda_2)$ at the different wavelengths, it is considered that the similar tendency can be seen.

As seen from the results in FIGS. 14A to 14D, changes in $D_1$ and $D_2$ among the optical path lengths have large effect on the intensity, thus $D_1$ and $D_2$ are the main parameters that determine the microcavity structure. On the other hand, it was confirmed that $D_3$ has small effect, and $D_4$ has almost no effect.

In this exemplary device, preferable optical path lengths were calculated using the following equations.

$$D_1(\lambda_1) = \phi_1(\lambda_1) * (\lambda_1/4\Pi) + (\lambda_1 * l/2)$$

$$D_3(\lambda_2) = \phi_2(\lambda_2) * (\lambda_2/4\Pi) + (\lambda_2 * m/2)$$

$$D_1(\lambda_1) + D_2(\lambda_1) = (\phi_1(\lambda_1) + \phi_2(\lambda_1)) * (\lambda_1/4\Pi) + (\lambda_1 * n/2)$$

Note that, although l, m, and n are integers of 0 or more, these are all set to be 0 in the following calculations.

Substituting the values of the phase shifts $\phi_1$ and $\phi_2$ in TABLE 4 into the equations, the optical path lengths have been calculated as follows. Note that, in the following equations, angles are shown in degree [deg] that is converted from radian [rad].

$$D_1(\lambda_1) = 150 * (600/720) = 125 \text{ (nm)}$$

$$D_3(\lambda_2) = 110 * (460/720) = 70 \text{ (nm)}$$

$$D_1(\lambda_1) + D_2(\lambda_1) = 280 * (600/720) = 230 \text{ (nm)}$$

These results almost correspond to the thicknesses at which the intensity takes the maximum values in FIGS. 14A to 14D. Note that, although $D_3(\lambda_2)$ deviates slightly from the optimum thickness condition due to receiving the effect of light that is increased by the cavity, it is still in the preferable range, and the effect thereof is small because the increase/ decrease degree of the intensity with respect to the thickness change of $D_3(\lambda_2)$ is small. Intensity peaks occur at $D_1(\lambda_1)$ of 140 nm and at $D_2(\lambda_1)$ of 80 nm, respectively. Therefore, from TABLE 4, $D_1(\lambda_1)+D_2(\lambda_1)$ is calculated as 80+130=210 nm when $D_2(\lambda_1)$ is at the peak, and $D_1(\lambda_1)+D_2(\lambda_1)$ is calculated as 140+70=210 nm when $D_1(\lambda_1)$ is at the peak. Thus, it was confirmed that $D_1(\lambda_1)+D_2(\lambda_1)$ satisfies the preferable thickness condition.

Example 3

Organic electroluminescent elements which have a bottom emission structure shown in FIG. 7 but have the semi-transmissive layer (first interlayer 3a) with different thicknesses as shown in TABLE 5 were fabricated. Here, two-types of elements were fabricated, one of which is provided with the light diffusion layer 9 at the outside surface of the substrate 8, and the other is without the light diffusion layer 9. In the element with the light diffusion layer 9, the optical path length ($D_d(\lambda_1)$) at the wavelength $\lambda_1$ between the face of the light diffusion layer 9 close to the outcoupling side and the semi-transmissive layer is designed to be ten times or more as long as the emission peak wavelength ($\lambda_1$) of the first light-emitting unit 6a (see FIG. 3). In each element, chromaticity was measured with a luminance meter system, and viewing angle characteristics (viewing angle dependence) was evaluated. Moreover, for the elements that have the same thickness condition of the semi-transmissive layer, improvement of the light outcoupling efficiency with/without the light diffusion layer 9 was evaluated as a light outcoupling magnification ratio. Note that the configuration of the element is that of shown in TABLE 4, and the thickness of the Ag semi-transmissive layer is changed as the parameter. The viewing angle characteristics was evaluated using values ($_\Delta u'$, $_\Delta v'$) of (max-min) in viewing angles 0° to 80° of 1976CIE standard value (u', v') in which 1931CIE color specification system (x, y, z) as shown later was used. The smaller the value is, the smaller the viewing angle dependence becomes, and light-emission can be obtained in a wide viewing angle.

$$u'=4x/(-2x+12y+3)$$

$$v'=9y/(-2x+12y+3)$$

The viewing angle characteristics and the light outcoupling property with/without the light diffusion layer 9 are shown in TABLE 5.

It can be seen in TABLE 5 that in a case where the light diffusion layer 9 is not provided, as the Ag thickness of the semi-transmissive layer increases, the microcavity effect becomes intensified, and since the light intensity in a specific direction increases, viewing angle dependency increases. In a case where the light diffusion layer 9 is provided, the value of ($_\Delta u'$, $_\Delta v'$) becomes small, and viewing angle dependence is suppressed. This suppression of the viewing angle dependence can also be seen when the Ag thickness becomes large and the microcavity effect is significantly enhanced. In this way, it was confirmed that the viewing angle characteristics have improved by providing the light diffusion layer 9.

Moreover, as seen in TABLE 5, it was confirmed that the light outcoupling efficiency has increased by providing the light diffusion layer 9, compared with the case where the light diffusion layer 9 was not provided. This may be a result from some of the light in the substrate waveguide mode being extracted. However, as the Ag thickness increases and the microcavity effect becomes intensified, the distribution of light that arrives at the substrate is changed such that more light is concentrated in the frontal direction, the total reflection itself decreases, and as a result an apparent gain (improvement in light outcoupling property) tends to decrease. Therefore, the improvement of the light outcoupling efficiency due to the light diffusion layer 9 is confirmed to be more apparent when the semi-transmissive layer is thin.

TABLE 5

| Interlayer Ag film thickness | Viewing angle characteristics | | | | Light outcoupling property | |
|---|---|---|---|---|---|---|
| | without light diffusion layer | | with light diffusion layer | | without light diffusion layer (reference) | with light diffusion layer (times) |
| | Δu' | Δv' | Δu' | Δv' | | |
| 0 nm | 0.007 | 0.012 | 0.003 | 0.006 | 1 | 1.5 |
| 10 nm | 0.024 | 0.003 | 0.009 | 0.002 | 1 | 1.45 |
| 15 nm | 0.050 | 0.008 | 0.019 | 0.003 | 1 | 1.4 |
| 30 nm | 0.072 | 0.010 | 0.033 | 0.007 | 1 | 1.35 |

Description of Reference Numerals

1 First Electrode
2 Second Electrode
3 Interlayer
4 Light-Emitting Layer
4a First Light-Emitting Layer
4b Second Light-Emitting Layer
5 Light-Emitting Source
5a First Light-Emitting Source
5b Second Light-Emitting Source
6 Light-Emitting Unit
6a First Light-Emitting Unit
6b Second Light-Emitting Unit
7 Charge Auxiliary Layer
8 Substrate
9 Light Diffusion Layer
10 Transparent Resin Layer

The invention claimed is:

1. An organic electroluminescent element with a structure in which a plurality of light-emitting layers are stacked between a first electrode with light reflectivity and a second electrode with optical transparency while one or more interlayers with a light transmissive property are interposed between the plurality of light-emitting layers,
wherein:
the one or more interlayers includes a first interlayer closest to the first electrode;
a first light-emitting unit is formed between the first electrode and the first interlayer to include a first light-emitting layer which is one of the plurality of light-emitting layers and has a first light-emitting source;
a second light-emitting unit is formed on a side of the first interlayer close to the second electrode to include a second light-emitting layer which is one of the plurality of light-emitting layers and has a second light-emitting source; and
the first interlayer is a semi-transmissive layer which has both of optical transparency and light reflectivity and has a total light absorption ratio of 10% or less, wherein
the organic electroluminescent element has a characteristic which satisfies relations of:

$0.9*X \leq D1(\lambda 1) \leq 1.1*X;$ $0.1*Y \leq D3(\lambda 2) \leq 2.0*Y;$ and $0.8*Z \leq D1(\lambda 1)+D2(\lambda 1) \leq 1.2*Z,$ wherein:
$\lambda 1$ represents a weighted-averaged emission wavelength of the first light-emitting source;
$\lambda 2$ represents a weighted-averaged emission wavelength of the second light-emitting source;
$D1(\lambda 1)$ represents an optical path length defined as a product of a refractive index at the wavelength $\lambda 1$ and a thickness with regard to a medium situated between the first light-emitting source and the first electrode;
$D2(\lambda 1)$ represents an optical path length defined as a product of a refractive index at the wavelength $\lambda 1$ and a thickness with regard to a medium situated between the first light-emitting source and the semi-transmissive layer;
$D3(\lambda 2)$ represents an optical path length defined as a product of a refractive index at the wavelength $\lambda 2$ and a thickness with regard to a medium situated between the second light-emitting source and the semi-transmissive layer; and
X, Y, and Z satisfy equations of $X=\phi 1(\lambda 1)*(\lambda 1/4\pi)+\lambda 1*l/2$, $Y=(\phi 2(\lambda 2)*(\lambda 2/4\pi)+\lambda 2*m/2$, and $Z=\phi 1(\lambda 1)+\phi 2(\lambda 1)*(\lambda 1/4\pi)+\lambda 1*n/2$, respectively,
wherein:
l, m, and n are integers of 0 or more, respectively;
$\phi 1$ represents a phase shift expressed by a following formula (1) which occurs at the first electrode;
$\phi_2$ represents a phase shift expressed by the following formula (1) which occurs at the semi-transmissive layer;
$\phi_1(\lambda_1)$ represents a phase shift of light emitted from the first light-emitting source which arises from reflection at the first electrode;
$\phi_2(\lambda_1)$ represents a phase shift of light emitted from the first light-emitting source which arises from reflection at the semi-transmissive layer;
$\phi_2(\lambda_2)$ represents a phase shift of light emitted from the second light-emitting source which arises from reflection at the semi-transmissive layer; and
the formula (1) is:

$$\varphi = \tan^{-1}\left\{\frac{2(n_1 k_2 - n_2 k_1)}{n_1^2 - n_2^2 + k_1^2 - k_2^2}\right\}, \quad (1)$$

wherein:
$n_1$ and $k_1$ representing a refractive index and an extinction coefficient of a layer in contact with a reflection layer, respectively;
$n_2$ and $k_2$ representing a refractive index and an extinction coefficient of the reflection layer, respectively; and
$n_1, n_2, k_1,$ and $k_2$ are functions of $\lambda$.

2. The organic electroluminescent element as set forth in claim 1, wherein the semi-transmissive layer has a total light reflectance of 10% or more but less than 50%.

3. The organic electroluminescent element as set forth in claim 1, wherein the semi-transmissive layer contains Ag or an alloy of Ag as a main component.

4. The organic electroluminescent element as set forth in claim 1, wherein l is not less than 1 in the equation for X.

5. The organic electroluminescent element as set forth in claim 1, wherein l, m, and n are not less than 1, respectively in the equations for X, Y, and Z.

6. The organic electroluminescent element as set forth in claim 1, further comprising a light diffusion layer on an outcoupling face of the second electrode.

7. The organic electroluminescent element as set forth in claim 6, wherein
an optical path length $D_d(\lambda_1)$ between a face of the light diffusion layer close to an outcoupling side and the semi-transmissive layer at the wavelength $\lambda_1$ is ten times or more as long as an emission wavelength $\lambda_1$ of the first light-emitting unit.

8. The organic electroluminescent element as set forth in claim 6, further comprising a substrate with optical transparency on the outcoupling face of the second electrode,
wherein
the substrate has a refractive index of 1.55 or more.

* * * * *